(12) United States Patent
Drost et al.

(10) Patent No.: US 8,299,839 B2
(45) Date of Patent: Oct. 30, 2012

(54) CAPACITIVELY AND CONDUCTIVELY COUPLED MULTIPLEXER

(75) Inventors: Robert J. Drost, Los Altos, CA (US); Alex Chow, Palo Alto, CA (US); Robert D. Hopkins, Hayward, CA (US)

(73) Assignee: Oracle America, Inc., Redwood Shores, CA (US)

( * ) Notice: Subject to any disclaimer, the term of this patent is extended or adjusted under 35 U.S.C. 154(b) by 87 days.

(21) Appl. No.: 12/352,481

(22) Filed: Jan. 12, 2009

(65) Prior Publication Data
US 2010/0176878 A1 Jul. 15, 2010

(51) Int. Cl.
*H03K 17/00* (2006.01)
(52) U.S. Cl. ............................ 327/407; 327/408
(58) Field of Classification Search .......... 327/407–409, 327/411, 412
See application file for complete search history.

(56) References Cited

U.S. PATENT DOCUMENTS

| 4,760,346 A * | 7/1988 | Kultgen et al. ................. 330/69 |
| 7,616,926 B2 * | 11/2009 | Drost ........................... 455/41.1 |
| 7,674,648 B2 * | 3/2010 | Compton et al. ............... 438/59 |
| 2003/0214329 A1 * | 11/2003 | Shin .............................. 327/143 |

* cited by examiner

*Primary Examiner* — Lincoln Donovan
*Assistant Examiner* — Diana J Cheng
(74) *Attorney, Agent, or Firm* — Park, Vaughan, Fleming & Dowler LLP; Steven E. Stupp

(57) ABSTRACT

A capacitively and conductively coupled multiplexer ($C^3$mux) circuit is described. This $C^3$mux circuit includes a set of nonlinear coupling capacitors, such as metal-oxide-semiconductor (MOS) transistors, that can multiplex multiple input signals while minimizing the parasitic capacitance penalty associated with the 'off' paths. In particular, the capacitance of a given MOS transistor depends on whether its channel is present or absent. Furthermore, this channel is formed based on whether the gate-to-source and drain voltages for the MOS transistor are greater than the MOS transistor's threshold voltage. Note that the capacitance of the MOS transistors in the $C^3$mux circuit is low for the unselected inputs. Consequently, the parasitic loading and the delay increase slowly as a function of the number of inputs. Moreover, the conductive feedback can be used to maintain a DC level of the input signals.

17 Claims, 18 Drawing Sheets

CAPACITIVELY AND CONDUCTIVELY COUPLED MULTIPLEXER

BACKGROUND

1. Field of the Invention

The present invention relates to circuits that selectively route electrical signals. More specifically, the present invention relates to multiplexer circuits that include components having nonlinear capacitances.

2. Related Art

A multiplexer is a fundamental component, which is widely used in digital circuits. Given one or more selection signals, a multiplexer switches one of a number (N) of input signals onto an output signal. If the number N is small (such as between two and four), then conventional multiplexer designs are efficient and fast. However, some applications benefit from larger values of N, such as eight or more. For example, in programmable logic circuits, large fan-in multiplexers commonly interconnect many possible wiring paths and logic gates. Large fan-in multiplexers are also found in crossbar circuits.

Many circuit designers prefer to use large fan-in multiplexers in these applications because they facilitate a flexible architecture that is simple to model and characterize because many paths are simultaneously available. However, the multiple 'off' paths in these circuits add parasitic delay and increase energy consumption for the few 'on' paths, which limit the usefulness of the multiplexers in spite of their architectural advantages.

Hence, what is needed is a multiplexer circuit without the problems described above.

SUMMARY

One embodiment of the present invention provides a circuit that includes N input nodes which are configured to receive input signals on input signal paths, where a given input node is configured to receive a given input signal on a given input signal path. It also includes nonlinear capacitors, where a given nonlinear capacitor is coupled to the given input node. Note that the given nonlinear capacitor has a first capacitance, which is less than a threshold, in a non-selected state, and a second capacitance, which is greater than the threshold, in a selected state. The circuit also includes an output node, coupled to the nonlinear capacitors, which is configured to provide an output signal on an output signal path. Control logic in the circuit may be configured to provide at least one control signal to switch a state of at least one of the nonlinear capacitors to the selected state, thereby providing AC coupling for at least one of the input signals to the output node.

Note that a default state of each of the given nonlinear capacitors may be the non-selected state. Moreover, the input signals may include: digital signals that have approximately discrete values and/or analog signals that have continuous values.

In some embodiments, the given nonlinear capacitor includes a metal-oxide-semiconductor (MOS) transistor, and a capacitance of the given nonlinear capacitor, which can be the first capacitance or the second capacitance, is associated with gate-to-source capacitance and gate-to-drain capacitance of the MOS transistor. For example, the second capacitance may be associated with a channel between the drain and the source in the MOS transistor.

Furthermore, the control logic may be configured to provide at least the one control signal prior to the circuit receiving at least the one of the input signals.

In some embodiments, the circuit includes a DC-bias circuit which is configured to maintain a DC level of the output signal at a capacitively coupled signal level associated with the AC coupling of at least the one of the input signals to the output node.

Additionally, the circuit may include selection circuits. Inputs of a given selection circuit may be coupled to the given input node and the control logic, and an output of the given selection circuit may be coupled to the given nonlinear capacitor. For example, the selection circuits may include: static NAND gates, dynamic NAND gates, static NOR gates, or dynamic NOR gates. In addition, the selection circuits may include NMOS circuits and/or PMOS circuits. Moreover, the given nonlinear capacitor may include a MOS transistor, and the output of the given selection circuit may be coupled to a gate of the MOS transistor or to a source and a drain of the MOS transistor.

In some embodiments, the circuit includes an amplifier coupled to the nonlinear capacitor circuits and the output node. This amplifier circuit may include conductive feedback from the output node to one or more inputs to the amplifier. Note that at least the one of the nonlinear capacitors may include M nonlinear capacitors that are in the selected state, where M is greater than one and less than or equal to N. Additionally, a threshold of the amplifier may be selected to implement a logic function in which the output signal is asserted if P of the input signals corresponding to the M nonlinear capacitors are asserted, where P is less than or equal to M.

Another embodiment provides an integrated circuit which includes the circuit.

Another embodiment provides a multiplexer that includes the circuit.

Another embodiment provides a method for multiplexing at least one input signal to an output node. During operation, at least the one input signal is received on at least one of N input nodes. Moreover, at least one control signal is provided to switch a state of at least one nonlinear capacitor, which is coupled to at least the one of the N input nodes, to a selected state, thereby providing AC coupling for at least the one input signal to the output node. Note that at least the one nonlinear capacitor has a first capacitance, which is less than a threshold, in a non-selected state, and a second capacitance, which is greater than the threshold, in the selected state.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

A capacitively and conductively coupled multiplexer ($C^3$mux) circuit is described. This $C^3$mux circuit includes a set of nonlinear coupling capacitors, such as metal-oxide-semiconductor (MOS) transistors, that can multiplex multiple input signals while minimizing the parasitic capacitance penalty associated with the 'off' paths. In particular, the capacitance of a given MOS transistor depends on whether its channel is present or absent. Furthermore, this channel is formed based on whether the gate-to-source and drain voltages for the MOS transistor exceed the MOS transistor's threshold voltage. Note that the capacitance of the MOS transistors in the $C^3$mux circuit is low for the unselected inputs. Consequently, the parasitic loading and the delay increase slowly as a function of the number of inputs. Moreover, the conductive feedback can be used to maintain a DC level of the input signals.

In addition to reducing the input capacitance, the $C^3$mux circuit reduces the delay and the energy consumption relative to existing multiplexer circuits. Therefore, this $C^3$mux circuit is able to select among many inputs, from physically separated locations, with low incremental cost, and can drive a large output load.

Figure 1:
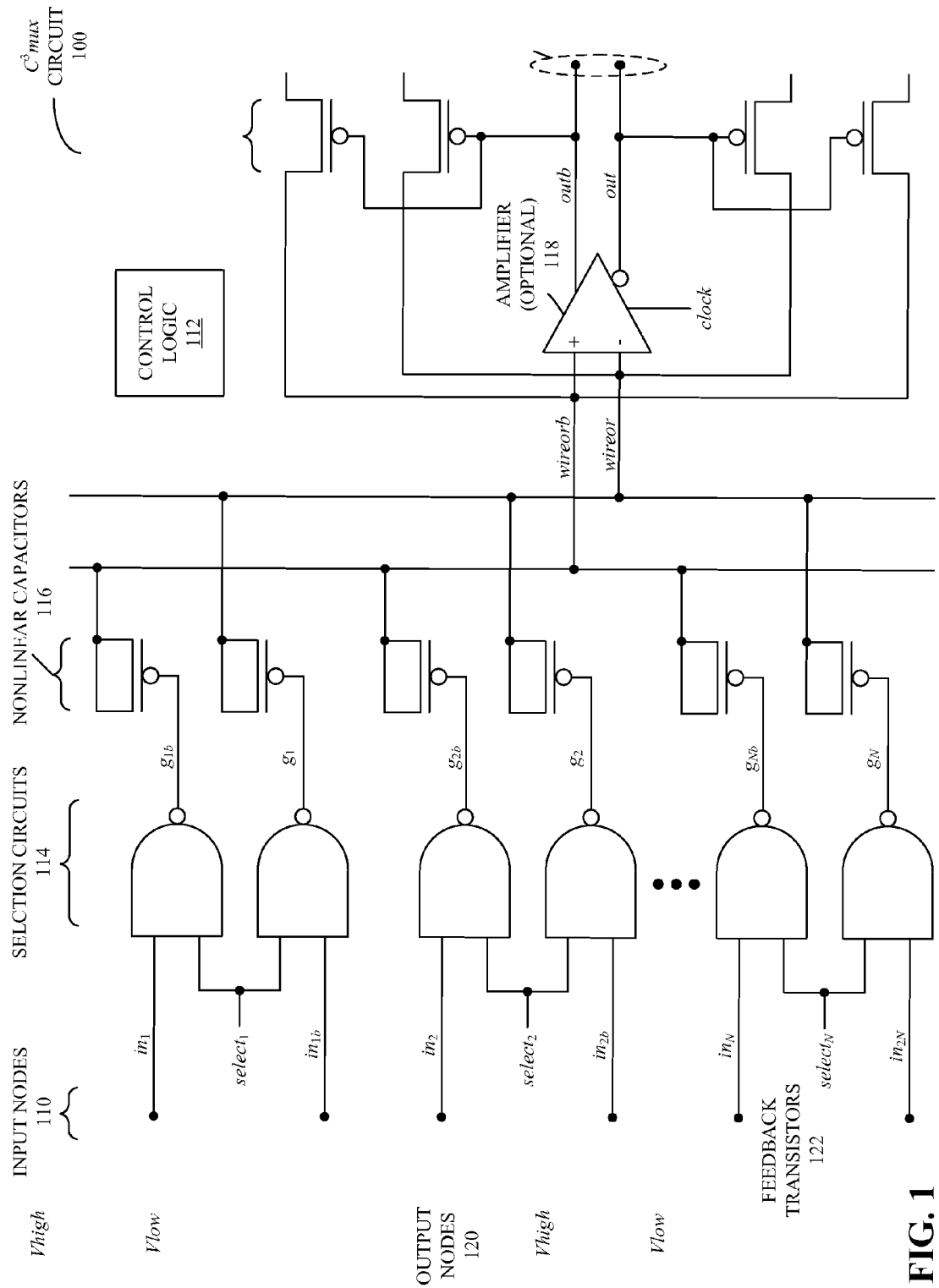
FIG. 1 is a block diagram illustrating a capacitively and conductively coupled multiplexer ($C^3$mux) circuit in accordance with an embodiment of the present invention.

We now describe embodiments of the $C^3$mux circuit. FIG. 1 presents a block diagram illustrating $C^3$mux circuit 100. $C^3$mux circuit 100 includes a number of complementary data inputs ($in_1$ to $in_N$ and $in_{1b}$ to $in_{Nb}$) at input nodes 110, and select inputs ($select_1$ to $select_N$) that are provided by control logic 112. In some embodiments, only one of the select inputs is high, and the remainder of the select inputs is low. This causes all but one of the intermediate signals ($g_i$ to $g_N$ and $g_{1b}$ to $g_{Nb}$), which are output by selection circuits 114, to be held high. For the high select signal, $select_i$, the corresponding intermediate signal, $g_i$, equals the inverse of its input, $in_i$. This leads to an increase in the capacitance $C_i$ of one of the nonlinear capacitors 116, which is coupled to the selected selection circuit. Consequently, $C_i$ couples $g_i$ to low-swing multiplexed nodes wireor and wireorb, and causes some signal swing to occur. Then, an optional clocked regeneration amplifier 118 (or a sense amplifier) amplifies $g_i$ to a full-swing digital output on output nodes 120. Note that the signal swing on the wireor nodes is set by the coupling ratio of $C_i$ from $g_i$ to wireor to the total parasitic capacitance on the wireor nodes. Producing larger signal swings typically requires a larger value of $C_i$, but reduces the amount of amplification in optional amplifier 118.

In the discussion that follows, the target signal swing on wireor and wireorb is about 200 mV for a 1.8 V supply voltage (or a coupling ratio of about ⅑). However, voltages in the range of 50 to 450 mV are expected to work reasonably well because sense amplifiers provide good sensitivity versus delay over a wide range of input voltages.

Note that the full-swing digital output voltages drive Vlow and Vhigh voltages through weak feedback transistors 122. This conductive feedback holds the wireor and wireorb nodes at the present state indefinitely and allows for operation with un-coded input signals (i.e., the conductive feedback maintains the DC level). While the feedback path is drawn as a continuous path, in some embodiments it may be clocked or sampled in order to improve timing margins or the stability of the feedback path.

Figure 2:
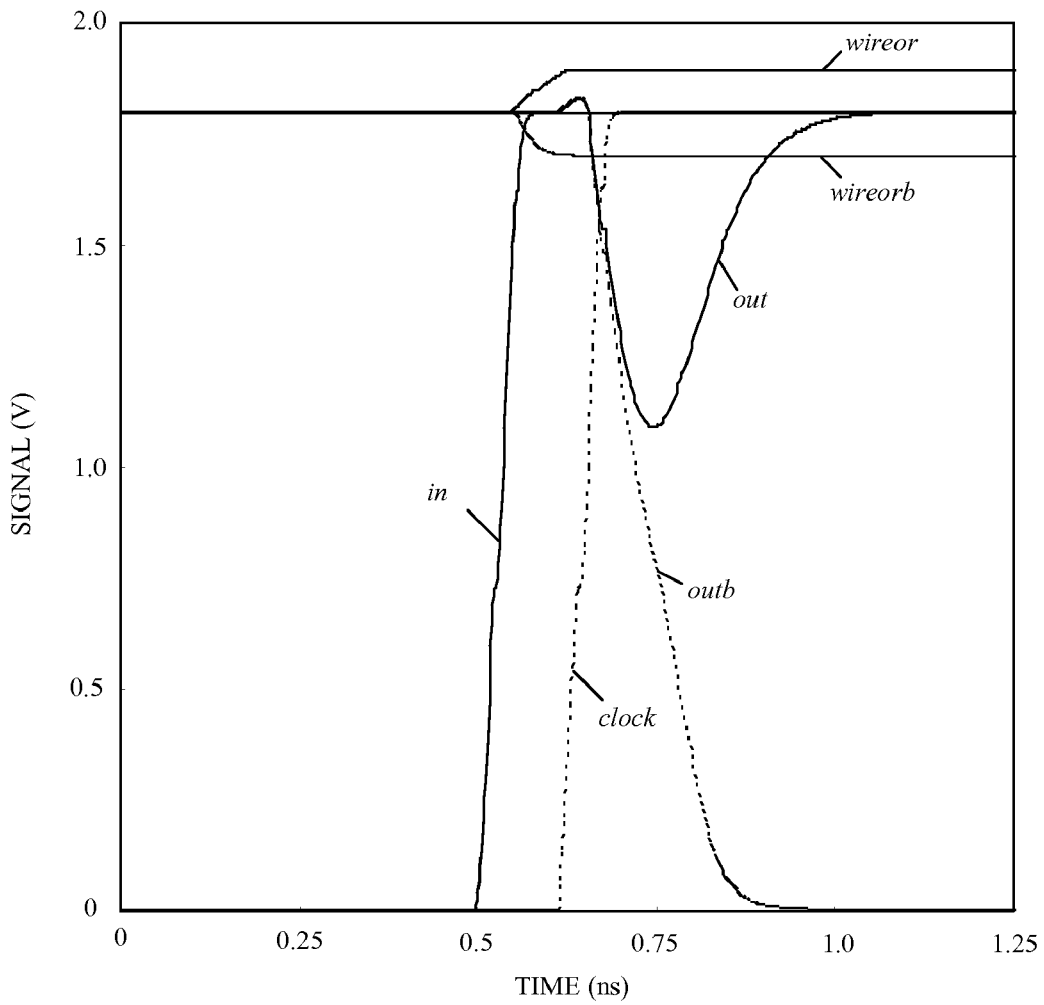
FIG. 2 is a graph illustrating waveforms for the $C^3$mux circuit of FIG. 1 in accordance with an embodiment of the present invention.

FIG. 2 presents a graph 200 illustrating waveforms for $C^3$mux circuit 100 (FIG. 1) with 16 inputs. In graph 200, the select signals (not shown) corresponding to the plotted input waveforms are high. When the input voltages swing, the wireor nodes experience small signal-swing transitions. Note that the clock signal triggers optional amplifier 118 (FIG. 1) and causes the wireor voltages to be amplified to full-swing digital outputs at the outputs of $C^3$mux circuit 100 (FIG. 1).

Figure 3:
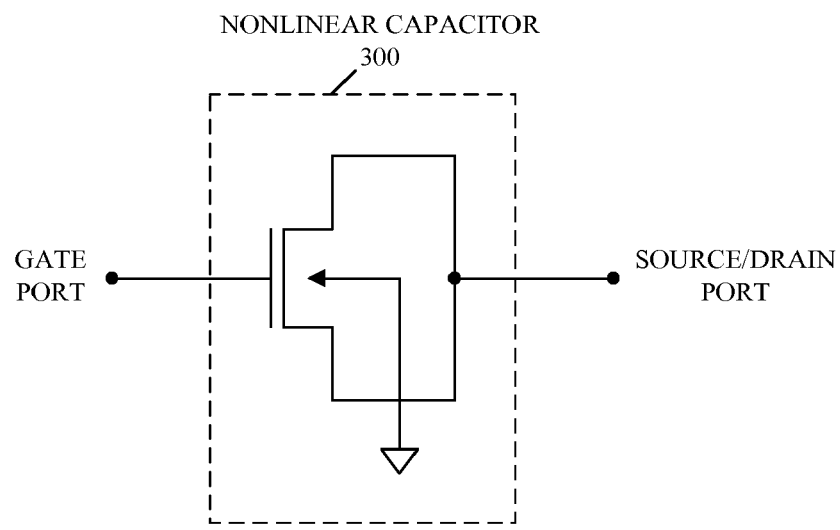
FIG. 3 is a block diagram illustrating a nonlinear capacitor in accordance with an embodiment of the present invention.

In some embodiments, MOS transistors are used as the nonlinear capacitors 116 (FIG. 1). A MOS transistor has a variable gate-to-source and gate-to-drain capacitance that can be much larger when the transistor is in enhancement mode. This MOS transistor provides this larger capacitance when in enhancement mode because a conductive channel forms underneath the gate oxide. FIG. 3 presents a block diagram illustrating a nonlinear capacitor 300. In particular, an NMOS transistor is coupled to two ports so that it acts as a nonlinear capacitor. One port couples to the gate and the other port couples to both the drain and the source. Note that, while the body of nonlinear capacitor 300 is illustrated as coupled to ground, in other embodiments the body may be coupled to an arbitrary voltage (such as in silicon-on-insulator technology or a deep-N well).

Figure 4A:
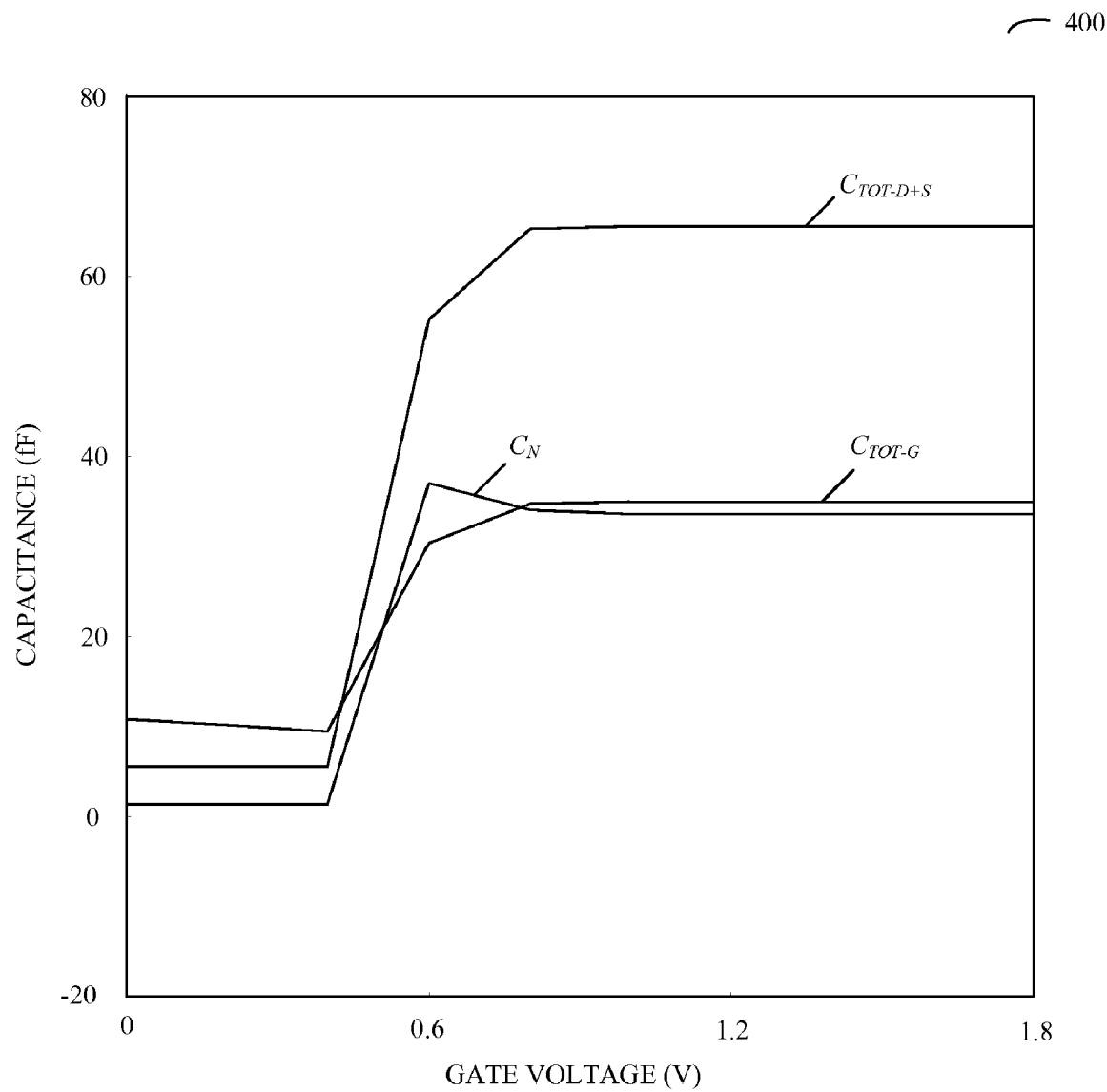
FIG. 4A is a graph illustrating total and nonlinear capacitance for the nonlinear capacitor of FIG. 3 in accordance with an embodiment of the present invention.

FIG. 4A presents a graph 400 illustrating total capacitance ($C_{TOT}$) on each port and nonlinear capacitance ($C_N$) between the ports for nonlinear capacitor 300 (FIG. 3) when the source and drain are held near 0 V and the gate is raised from 0 to 1.8 V. Given the source and drain voltages in the embodiments in this discussion, a gate voltage near 0 V minimizes all three capacitances, and a gate voltage near 1.8 V maximizes the capacitances. Ideally, the maximum value of $C_N$ is much larger than the minimum values of $C_{TOT-D+S}$ and $C_{TOT-G}$, so that the 'on' to 'off' ratio of capacitance values for a given one of nonlinear capacitors 116 (FIG. 1) is large and the 'off' paths in C³mux circuit 100 (FIG. 1) add minimal loading. In practice, the MOS transistor adds parasitic coupling to the substrate and parasitic coupling between the gate and the source and the drain. As a result, the ratio of the maximum value of $C_N$ to the minimum values of $C_{TOT-D+S}$ and $C_{TOT-G}$ are, respectively, 6.06 and 3.08 in this example.

Increasing the gate length of the MOS transistor increases this ratio for the source/drain port, but may reach a maximum of around four for the gate port as the ratio becomes dominated by the ratio of the gate-to-bulk capacitance to that of the gate-to-channel capacitance. As mentioned previously, increasing the ratio of the maximum value of $C_N$ to the minimum value of $C_{TOT}$ may improve the performance of C³mux circuit 100 (FIG. 1), especially when there is large fan-in (for example, where N is greater than three). In FIG. 4A, an NMOS transistor with a width of 2 μm and length of 2 μm was tested. Note that the ratio for $C_{TOT-D+S}$ can be increased to well over 10 by using narrower widths and longer lengths, which typically improve the performance of C³mux circuit 100 (FIG. 1). In some embodiments, gradient effects are avoided by using a common-centroid arrangement for the MOS transistor. Furthermore, the length of the MOS transistor may be selected based on the 'on' resistance.

Figure 4B:
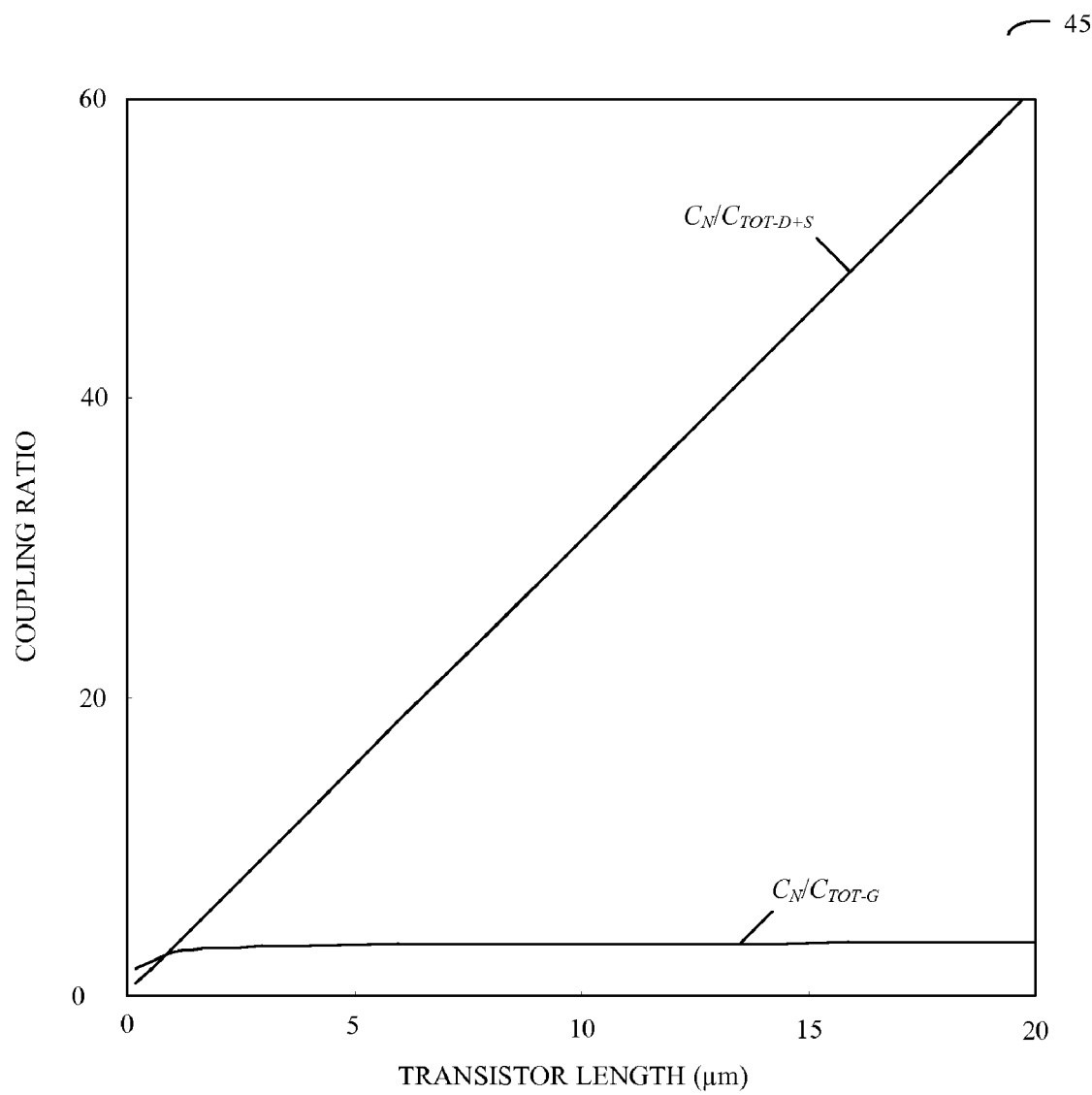
FIG. 4B is a graph illustrating the coupling ratio for the nonlinear capacitor of FIG. 3 in accordance with an embodiment of the present invention.

FIG. 4B presents a graph 450 illustrating the coupling ratio, $C_{NMax}$ to $C_{TOT-D+S}$, as a function of gate length for the gate and source/drain ports for nonlinear capacitor 300 (FIG. 3). Although the ratio is unbounded as the MOS transistor length increases, at high frequencies there may be attenuation problems because the transistor channel time constant increases for longer channel lengths. Fortunately, in this case, the gate polysilicon resistance associated with the width of the MOS transistor typically is not an issue because the MOS transistor may be contacted in parallel by a vector of polysilicon gate contacts.

We now describe the simulated behavior of a nonlinear capacitor constructed from an NMOS transistor. Note that the nonlinear behavior is similar for a PMOS transistor, with the change that drain and source voltages are held near to GND and the gate swings from GND to Vdd in C³mux circuit 100 (FIG. 1), and with NOR gates performing the selecting function in selection circuits 114 (FIG. 1). In FIG. 1, PMOS transistors provide the nonlinear capacitance so that the wireor node couples to the source/drain port and is biased to around Vdd. However, if the NAND-gate output is buffered with an inverter, then an NMOS transistor may be used, and the wireor voltage may be biased to around 0 V.

Figure 5:
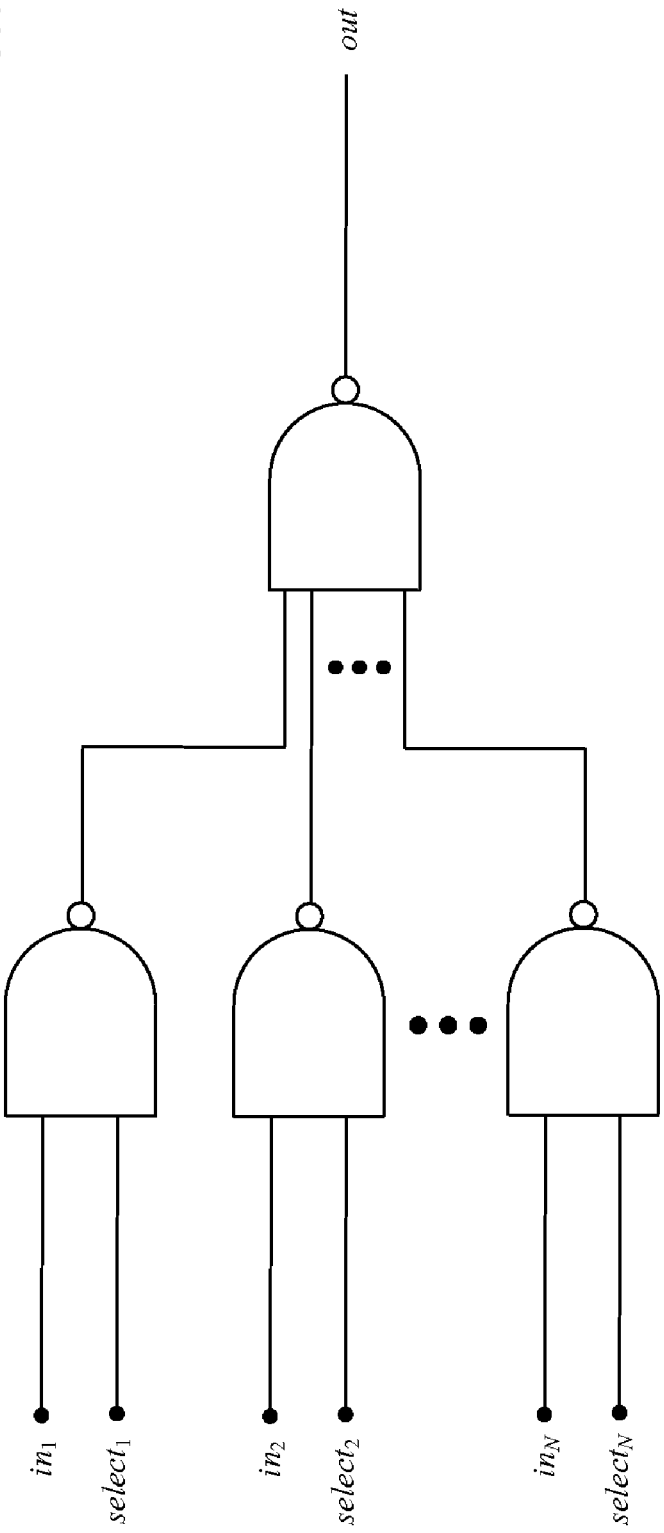
FIG. 5 is a block diagram illustrating an existing 2-stage NAND-gate multiplexer circuit.
Figure 6:
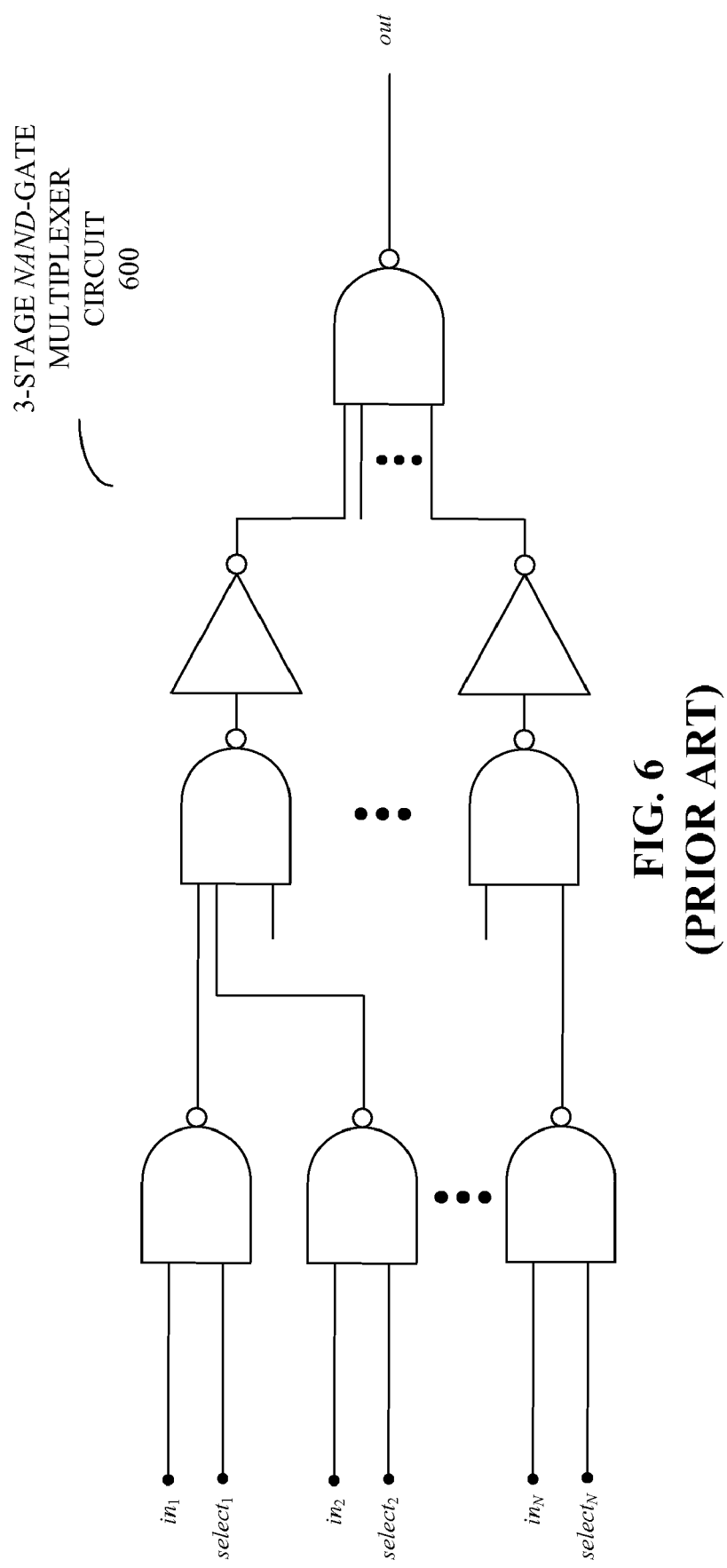
FIG. 6 is a block diagram illustrating an existing 3-stage NAND-gate multiplexer circuit.
Figure 7:
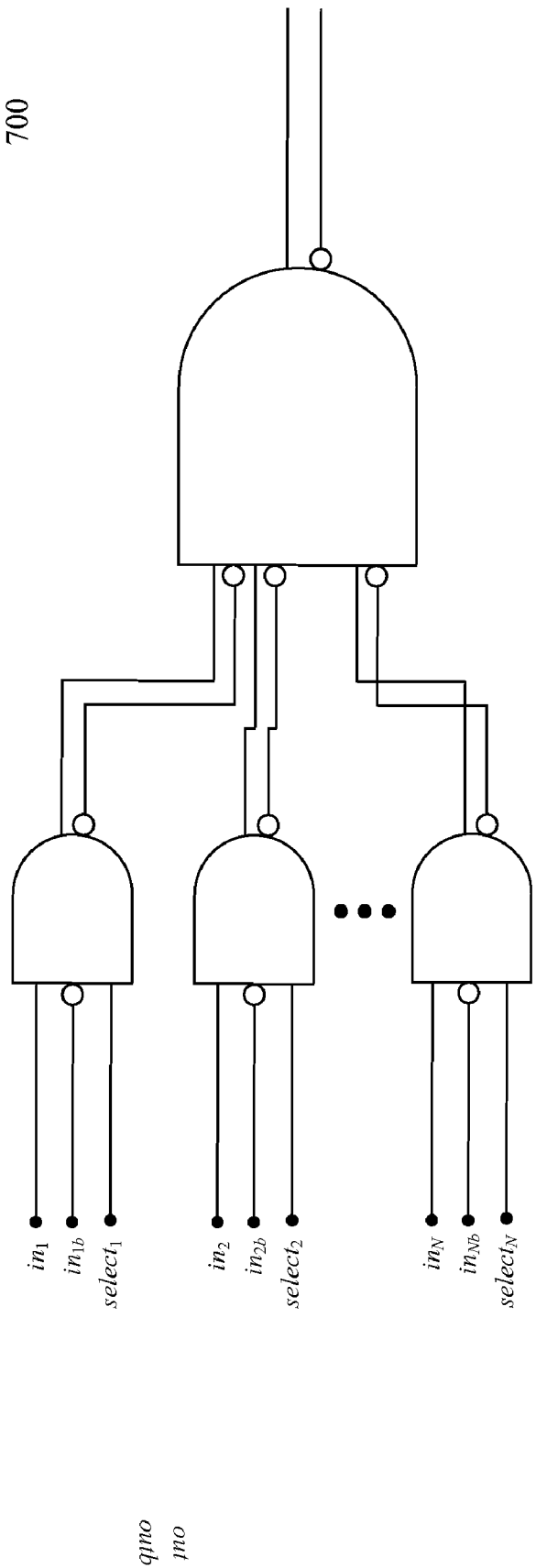
FIG. 7 is a block diagram illustrating an existing 2-stage dynamic NAND-gate multiplexer circuit.
Figure 8:
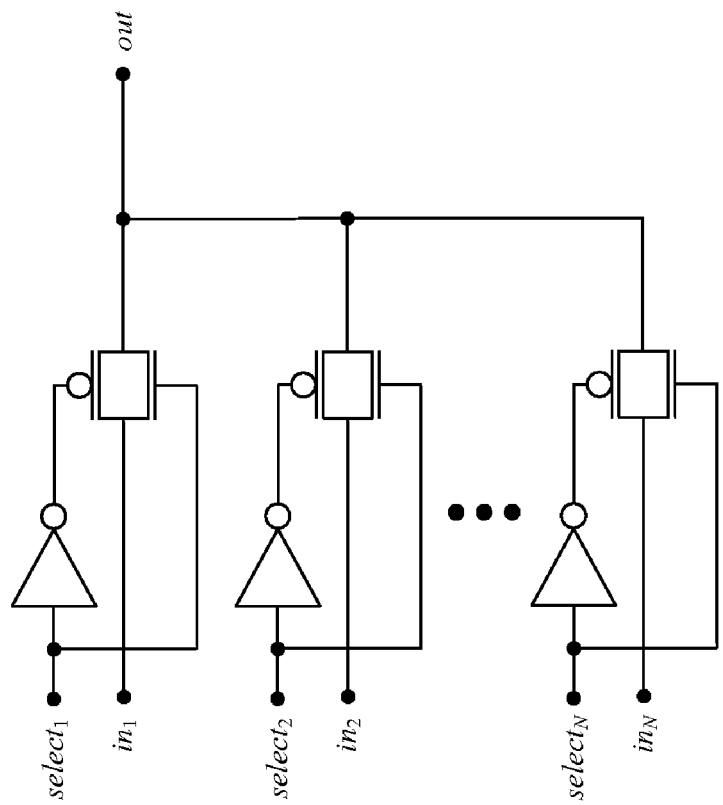
FIG. 8 is a block diagram illustrating an existing complementary pass-gate multiplexer circuit.

For purposes of comparison, existing multiplexer circuits are shown in FIGS. 5-8. In particular, FIG. 5 presents a block diagram illustrating an existing 2-stage NAND-gate multiplexer circuit 500, and FIG. 6 presents a block diagram illustrating an existing 3-stage NAND-gate multiplexer circuit 600. Moreover, FIG. 7 presents a block diagram illustrating an existing 2-stage dynamic (or domino) NAND-gate multiplexer circuit 700, and FIG. 8 presents a block diagram illustrating an existing complementary pass-gate multiplexer circuit 800.

In the simulations for all of the multiplexer circuits, each static and dynamic gate was sized for a fanout of four, including the logical effort of each gate topology and the effect of wire load. Slightly larger stepups were used in the later stages of the multiplexer circuits, and slightly lower stepups were used in earlier stages (which reduces energy consumption for a given delay).

Moreover, in the simulations, the multiplexer circuits were tested while driving a constant load capacitance while the number of inputs was varied. Each multiplexer circuit was sized to have reasonable delay per stage using back-of-the-envelope logical effort calculations. Given this sizing, the input capacitance was a little different for each circuit and for each fan-in quantity.

We now describe simulation conditions that fairly compared the different multiplexer circuits and equations that estimate the additional delay associated with larger input capacitance. In general, the additional capacitance on the inputs is charged the delay of an inverter chain (which drives the inputs in the simulations), which has the minimum delay, that reduces the input capacitance to the nominal value.

It can be tricky to fairly compare multiplexer circuits with different topologies. In particular, under similar simulation conditions, the different multiplexer circuits may present different: input capacitance, output resistance and/or parasitic delay. As simulation conditions vary, the number of inputs to the multiplexer circuits, the drive strength of these inputs, and the output load capacitance will vary, which may change a comparison metric, thereby potentially providing an erroneous indication of a positive or negative result.

In the simulations, the test conditions were similar to those likely in applications of C³mux circuit 100 (FIG. 1). Moreover, in the simulations, a multiplexer circuit undergoing testing drove a 500 fF load capacitance. In addition, there were between 2 and 16 inputs, each of which was separated in space by 500 μm (which is representative of embodiments where the inputs come from physically separated circuits). Furthermore, the multiplexer circuits included the interconnects necessary to couple to these distant circuits. These interconnects had a capacitance of 200 fF/mm and a resistance of 160 Ω/mm.

For a given multiplexer circuit, the normalized delay is obtained by multiplying the raw delay by $$\log_4\left(\frac{C_{in}}{C_{min}}\right) \cdot td4, \quad (1)$$

where Cmin is the minimum of all the input capacitances of all the various multiplexer circuits that were simulated, and td4 is the delay of an inverter with a fanout of four (which was 85 ps in these simulations).

Logical effort theory indicates that fanouts of around four generally provide a good tradeoff between circuit delay and power consumption. In the simulations, this fanout was used for the static and dynamic logic circuits (such as selection circuits 114 in FIG. 1). However, C³mux circuit 100 (FIG. 1) includes two elements, the capacitive merge nodes and optional clocked amplifier 118 (FIG. 1), that could not be sized using this logic effort rule-of-thumb. Instead, nonlinear capacitors 116 (FIG. 1) coupled to the merge node were sized so that the merge node swings by 200 mV differentially. Moreover, optional amplifier 118 (FIG. 1) was a simple alpha-style latch that was triggered when the merge node swung to 100 mV. In addition, while the delay through optional amplifier 118 (FIG. 1) was simulated for a static 100 mV swing, in the results described below an expected delay of 160 ps for the sense amplifier delay plus a skew allowance for the clock signal of 40 ps was added when the merge node crossed 100 mV (for a total added delay of 160 ps). This simplifies the simulations, but may have introduced an error because possible skew-induced delay variation in optional amplifier 118 (FIG. 1) may have been missed. Nonetheless, a conservative skew allowance for the clock signal of 40 ps was used, which penalized $C^3$mux circuit 100 (FIG. 1) relative to the existing NAND-gate multiplexer circuits in all of the simulations.

We now describe an equation for the total capacitance, including the inverter chains that were used to drive the inputs to the multiplexer circuits in the simulations. Given the targeted stepups and sizings, the input capacitance varied significantly for different multiplexer circuits and different amounts of fan-in. In order to compare the multiplexer circuits, a penalty was applied to fairly penalize the larger input-capacitance multiplexer circuits with respect to delay and power consumption. Once again, logical effort theory was used to help assess this penalty.

Note that adding an inverter chain in front of any larger input capacitance can be used to reduce the capacitance. While the number of inverter stages is discrete in practice, for the purpose of comparison, a continuous model was used in the simulations. This continuous model allowed any ratio of capacitances to be compared without the quantization effects that results from a discrete number of inverter stages. Furthermore, the inverters in these chains were sized with a fanout of four, and it was assumed that corresponding parasitic output capacitance equaled half of the inverter input capacitance. As noted previously, the FO4Delay (or td4) refers to the delay of an inverter that is loaded by four identical copies of itself. For the 180-micron technology used in the simulations, the FO4Delay was around 85 ps.

Given these conditions, the inverter chain in the simulations for the given multiplexer circuit was selected to add the following delay and total parasitic capacitance, thereby reducing a measured input capacitance (Chigh) of the input port in the multiplexer circuit under test to the desired input capacitance (Clow) for the buffering inverter chain (which was chosen to be 3 fF in all of the simulations). Define the total fanout as $$F = \frac{Chigh}{Clow}, \qquad (2)$$

and the stepup as the ratio of load to input capacitance for each inverter in the chain, or $$fsu = \frac{Cout}{Cin}. \qquad (3)$$

(Note that in the simulations, an inverter chain with the same stepup for each inverter was used. While it is well known that the last stages in an inverter chain that drive the largest capacitive load typically have larger stepups and early stages typically have lower stepups, in order to reduce the power consumption for a given delay, in the simulations, one stepup was used for simplicity.) Moreover, the number of stages (M) is given by the number of inverters in the chain that need to be inserted to reduce the input capacitance given the stepup per stage, or $$\log_{fsu}(F). \qquad (4)$$

(In reality, M is an integer, but, as noted previously, continuous values were used to avoid quantization effects in the analysis.) Additionally, the delay (D) added by the inverter chain is the delay per stage multiplied by the number of stages, or $$D = \text{Delay}_{Fanoutof4} \cdot M \qquad (5)$$

Furthermore, the capacitance added by an inverter in the chain is the output load, Cload, divided by the stepup of the stage, and an inverter has a self-load capacitance $\gamma$ on its output (which varies between about 0.6 and 1 depending on the folding layout of the transistor and transistor parasitic parameters). Thus, the capacitance of the inverter chain (Cinv) is $$Cinv = Cload \cdot \frac{1+\gamma}{fsu}, \qquad (6)$$

which corresponds to the power added by the inverter chain.

The total capacitance of the inverter chain is the sum of the series of inverters in the chain, or $$Ctotal\_inv = Cin \cdot \left[\frac{1+\gamma}{fsu} + \left(\frac{1+\gamma}{fsu}\right)^2 + \ldots + \left(\frac{1+\gamma}{fsu}\right)^M\right]. \qquad (7)$$

Eqn. 7 can be solved using the discrete running sum of a diminishing series. For example, $S = a + a^2 + \ldots + a^M$ can be reduced by subtracting $aS = a^2 + a^3 + \ldots + a^{M+1}$, which yields $$S = \frac{a(1-a^M)}{1-a}. \qquad (8)$$

If a is less than one and M approaches infinity, then we obtain the familiar result $$S = \frac{a}{1-a}. \qquad (9)$$

Using Eqn. 9, the running sum can be reduced to $$Ctotal\_inv = Cin \cdot \frac{fsu - \frac{(1+\gamma)^{M+1}}{fsu^M}}{fsu - (1+\gamma)}. \qquad (10)$$

While Eqn. 10 appears complicated, it has the correct behavior for simple cases. For example, for $\gamma$ equal to zero, M approaching infinity, and an fsu of two, Eqn. 10 equals 2Cin. This is what is expected for the series $$Ctotal\_inv = Cin \cdot \left[1 + \frac{1}{2} + \frac{1}{4} + \frac{1}{8} + \ldots\right]. \qquad (11)$$

Alternatively, with an fsu of four, Eqn. 10 equals 4Cin/3. This is what is expected for the series $$Ctotal\_inv = Cin \cdot \left[1 + \frac{1}{4} + \frac{1}{16} + \frac{1}{64} + \ldots\right]. \qquad (12)$$

We now compare $C^3$mux circuit 100 (FIG. 1) against existing complementary pass-gate, static NAND-gate, and dynamic NAND-gate multiplexer circuits. In the simulations, these existing multiplexer circuits had as many stages as are optimal. Note that only the existing static NAND-gate multiplexer circuit included multiple stages for more than three inputs, and that the existing dynamic NAND-gate and pass-gate multiplexer circuits both included only a single stage for the 16 inputs cases that were simulated. Furthermore, $C^3$mux circuit 100 (FIG. 1) was simulated with static and dynamic NAND gates in selection circuits 114 (FIG. 1).

In the simulations, the interconnect length that was spanned to travel from each input to the output was apportioned equally across the stage of logic as an approximation for a balanced layout where all inputs are equidistant from the output. Note that an unbalanced layout would favor the $C^3$mux circuit 100 (FIG. 1) further as its delay is more tolerant to long interconnects. As noted previously, each multiplexer input was assumed to be an additional 500 microns away from the output, and all of the simulations were performed using Spice models for 0.18-μm CMOS technology.

Note that the simulated energy comparisons assumed a data activity factor of 50%. Moreover, the measured energy included all clocking energy, as well as the estimated energy consumed by the chains of inverters that normalized the input capacitance. This energy in these chains is estimated to be 1.5 times the sum of the input capacitances of all the inputs (for the select signals and the input signals) of a given multiplexer circuit, $C_L$. (Eqn. 10 provides an exact general formula, which has a few additional factors).

For existing 3-stage NAND-gate multiplexer circuit 600 (FIG. 6) with large fan-in, multiple topologies are possible. In the simulations, the topology with the best delay was used. Of course, 2- or 3-input multiplexer circuits can only be implemented using two stages of NAND gates. While the 3-stage NAND-gate design incurs larger delay for a small number of inputs, the delay increases much more slowly as the number of inputs increases. Moreover, the input capacitance is significantly lower because the output capacitive load and the internal wire parasitic capacitance are stepped down over an extra NAND-gate stage and an extra inverter.

For existing 3-stage NAND-gate multiplexer circuit 600 (FIG. 6), a number of the NAND gates have multiple inputs. For these gates, the delay was estimated for an input to the middle of the stack in order to pick a middle value. Note that the length of the wire in each branch in the simulations was the average of the shortest and longest lengths.

Furthermore, existing 2-stage dynamic NAND-gate multiplexer circuit 700 (FIG. 7) has the same gate-level topology as a static NAND-gate design. However, the dynamic NAND gates offer extremely low input capacitance for a given delay at the cost of some additional clocking. Note that the clocked tail transistor was sized to be twice the size of the input NMOS gate. Additionally, a clocked PMOS pre-charge device was sized to be twice the size of the input NMOS gate, and the output of each first-stage dynamic NAND gate was coupled to the second-stage through an additional 0.5 mm of wire for each input.

For complementary pass-gate multiplexer circuit 800, complementary pass-gates where the PMOS transistor has twice the width of the NMOS transistor were used. Note that each input 'sees' an inverter which drives the input side of the pass-gate. Furthermore, the inverter was sized for a fanout of four, using estimates of the 'on' and 'off' capacitances of the pass-gate and including the effect of wire load. Because each 'off' pass-gate still adds significant loading to the common output node, it is expected that the input capacitance of the pass-gate design will increase very rapidly as a function of the number of inputs. Additionally, the extra parasitic capacitance causes the pass-gates to increase in size to overcome that loading, which increases the parasitic load even further.

As shown in FIG. 1, $C^3$mux circuit 100 (FIG. 1) includes one stage of NAND gates in selection circuits 114 (FIG. 1) followed by nonlinear capacitors 116 (FIG. 1) that sum onto a common internal node. Summing by nonlinear capacitors 116 (FIG. 1) adds pre-emphasis to the multiplexed signals, which reduces the delay of $C^3$mux circuit 100 (FIG. 1). Summing onto the common-internal node is also low swing, which saves power for long interconnects or wires but may require optional amplifier 118 (FIG. 1) to restore full-digital signal swings.

In the simulations, optional amplifier 118 (FIG. 1) was sized with a fanout of four, such that the input capacitance to the amplifier is four times lower than that of the output load. Once again, a distance of 0.5 mm per input was used. Moreover, the coupling capacitors were sized and resized to maintain a constant 200 mV swing on the internal wireor and wireorb nodes. Additionally, the NAND gates were sized with a fanout of four from the nonlinear coupling capacitors 116 (FIG. 1). Because an NMOS-based optional amplifier 118 (FIG. 1) was used, the bit lines are nominally close to Vdd. Consequently, PMOS transistors were used to implement nonlinear capacitors 116 (FIG. 1).

$C^3$mux circuit 100 (FIG. 1) includes optional clocked regeneration amplifier 118 (FIG. 1) to regenerate the small swing to full swing. To compare it against the combinational logic cases, in simulations of clock skew, 160 ps was added to account for amplification delay. As expected, for low numbers of inputs fanning in to the multiplexer, this overhead dominated the overall delay.

Note that input capacitances for both static and dynamic NAND-gate designs and $C^3$mux circuit 100 (FIG. 1) are doubled for the input signals but not the select signals because they are differential. Furthermore, note that most of the (normalized) latency improvement of the dynamic $C^3$mux version comes from its lower input capacitance.

These designs were simulated for a typical 180-nm CMOS technology. It is expected that the relative speed improvement for $C^3$mux circuit 100 (FIG. 1) over the existing multiplexer circuits will improve for smaller technologies because $C^3$mux circuit 100 (FIG. 1) has an additional benefit with respect to interconnect or wire delays in the multiplexed combining node. As interconnects become slower relative to gates, $C^3$mux circuit 100 (FIG. 1) may improve more than the existing multiplexer circuits because of its ability to compensate for some of the interconnect delay using the pre-emphasis provided by the series nonlinear capacitor.

Figure 9A:
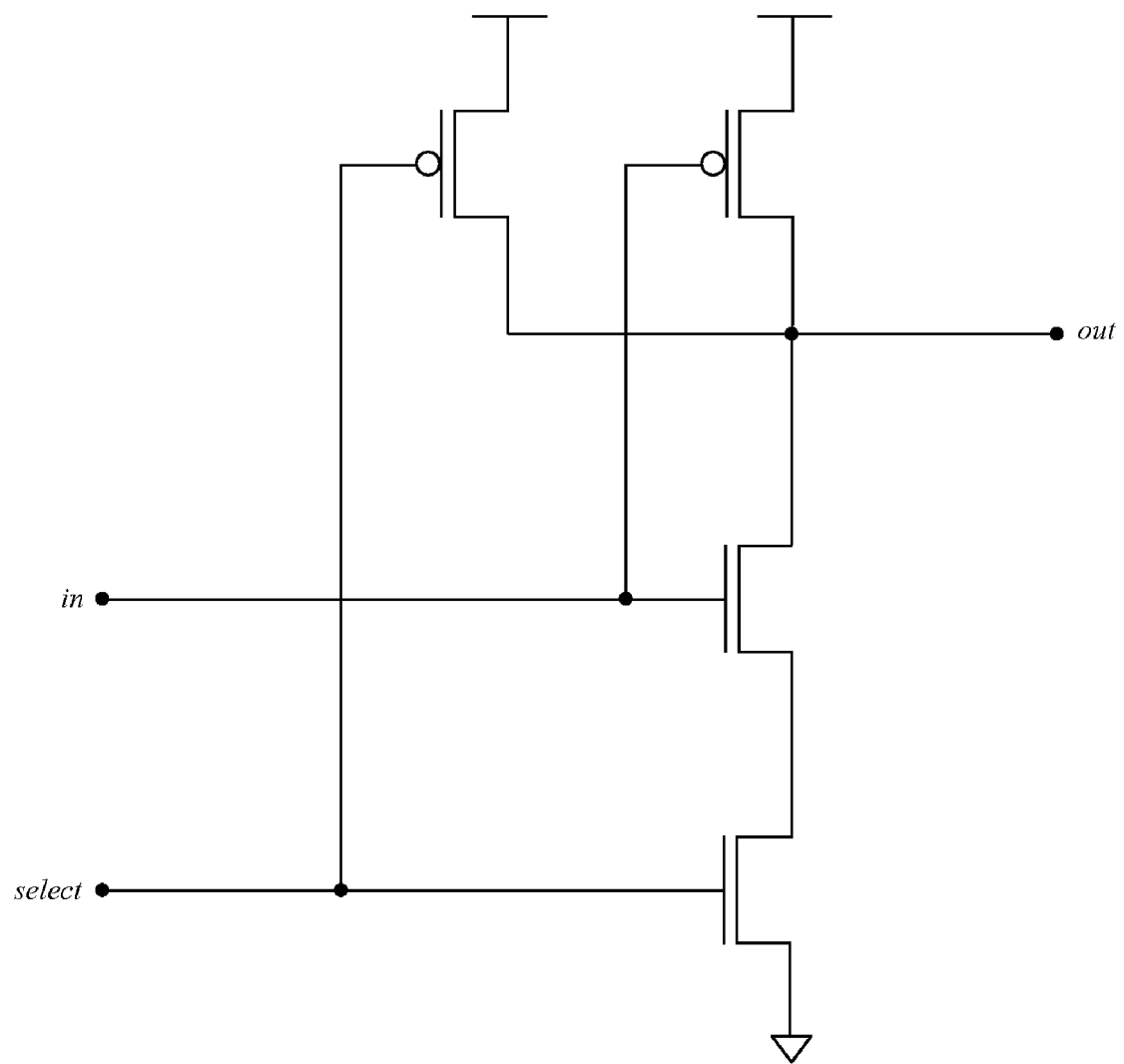
FIG. 9A is a block diagram illustrating a static two-input NAND-gate circuit in accordance with an embodiment of the present invention.
Figure 9B:
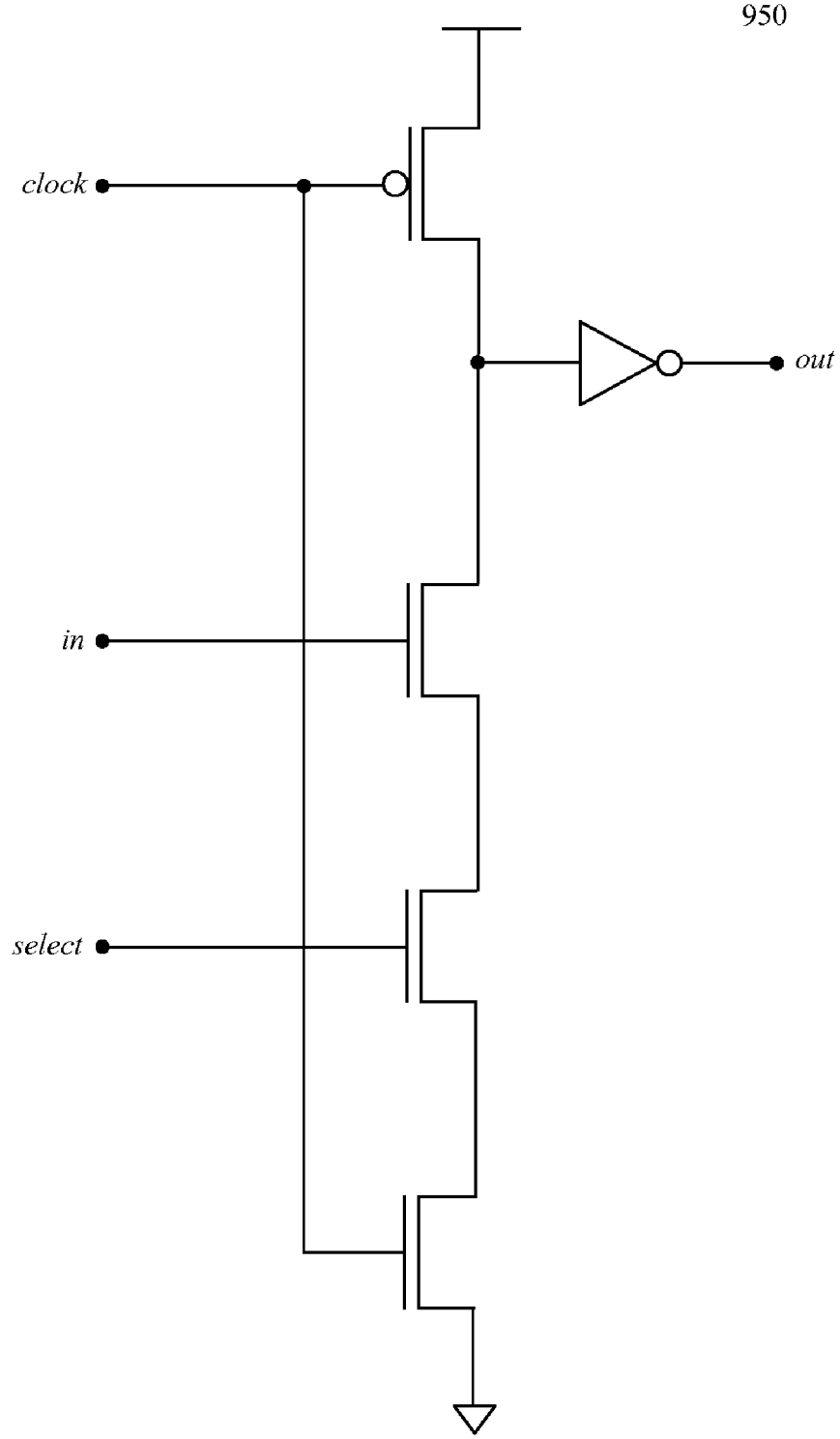
FIG. 9B is a block diagram illustrating a dynamic two-input NAND-gate circuit in accordance with an embodiment of the present invention.

$C^3$mux circuit 100 (FIG. 1) can be implemented using static NAND gates or dynamic NAND gates. This is illustrated in FIG. 9A, which presents a block diagram illustrating a static two-input NAND-gate circuit 900, and FIG. 9B, which presents a block diagram illustrating a dynamic two-input NAND-gate circuit 950. Because $C^3$mux circuit 100 (FIG. 1) can include optional clocked amplifier 118 (FIG. 1) on its output, re-using the clock signal for dynamic NAND gates does not add significant overhead. Note that $C^3$mux circuit 100 (FIG. 1) is particularly well-suited to conditions of large fan-in nodes that are separate over large distances and for large capacitance load.

Figure 10:
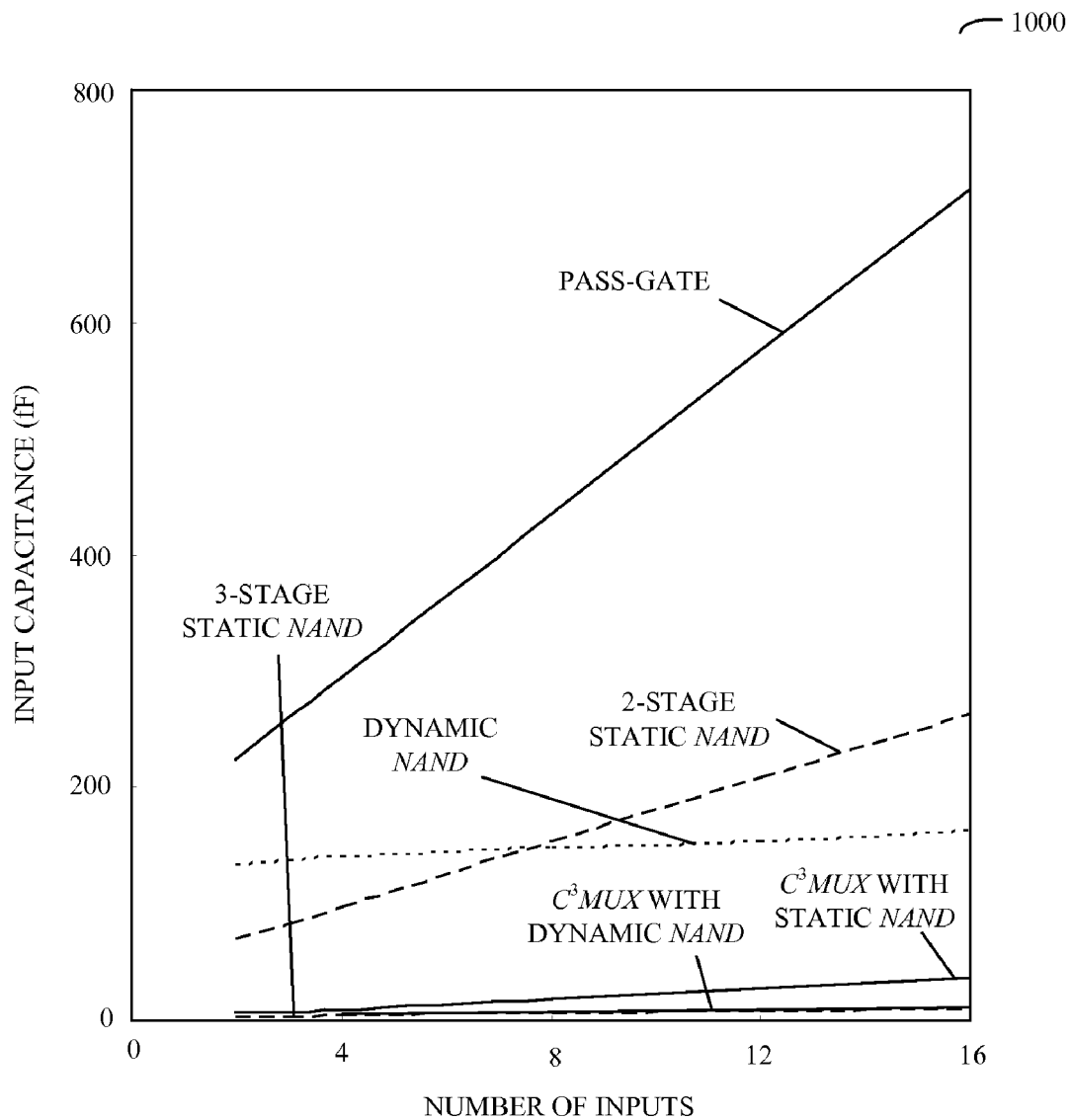
FIG. 10 is a graph illustrating input capacitance for various multiplexer topologies in accordance with an embodiment of the present invention.

FIG. 10 presents a graph 1000 illustrating input capacitance for various multiplexer circuits and topologies. In graph 1000, existing complementary pass-gate multiplexer 800 (FIG. 8) has the largest capacitance for all numbers of inputs. Moreover, existing 2-stage dynamic NAND-gate multiplexer circuit 700 (FIG. 7) has a larger capacitance than existing 2-stage NAND-gate multiplexer circuit 500 (FIG. 5) for a small number of inputs. However, the input capacitance of existing 2-stage dynamic NAND-gate multiplexer circuit 700 (FIG. 7) increases more slowly as the number of inputs increases, and performs better for more than eight inputs. Note that the static and dynamic versions of $C^3$mux circuit 100 (FIG. 1) and existing 3-stage NAND-gate multiplexer circuit 600 (FIG. 6) perform nicely, reducing the 500 fF output load to well under 100 fF for all of the fan-ins evaluated.

Figure 11A:
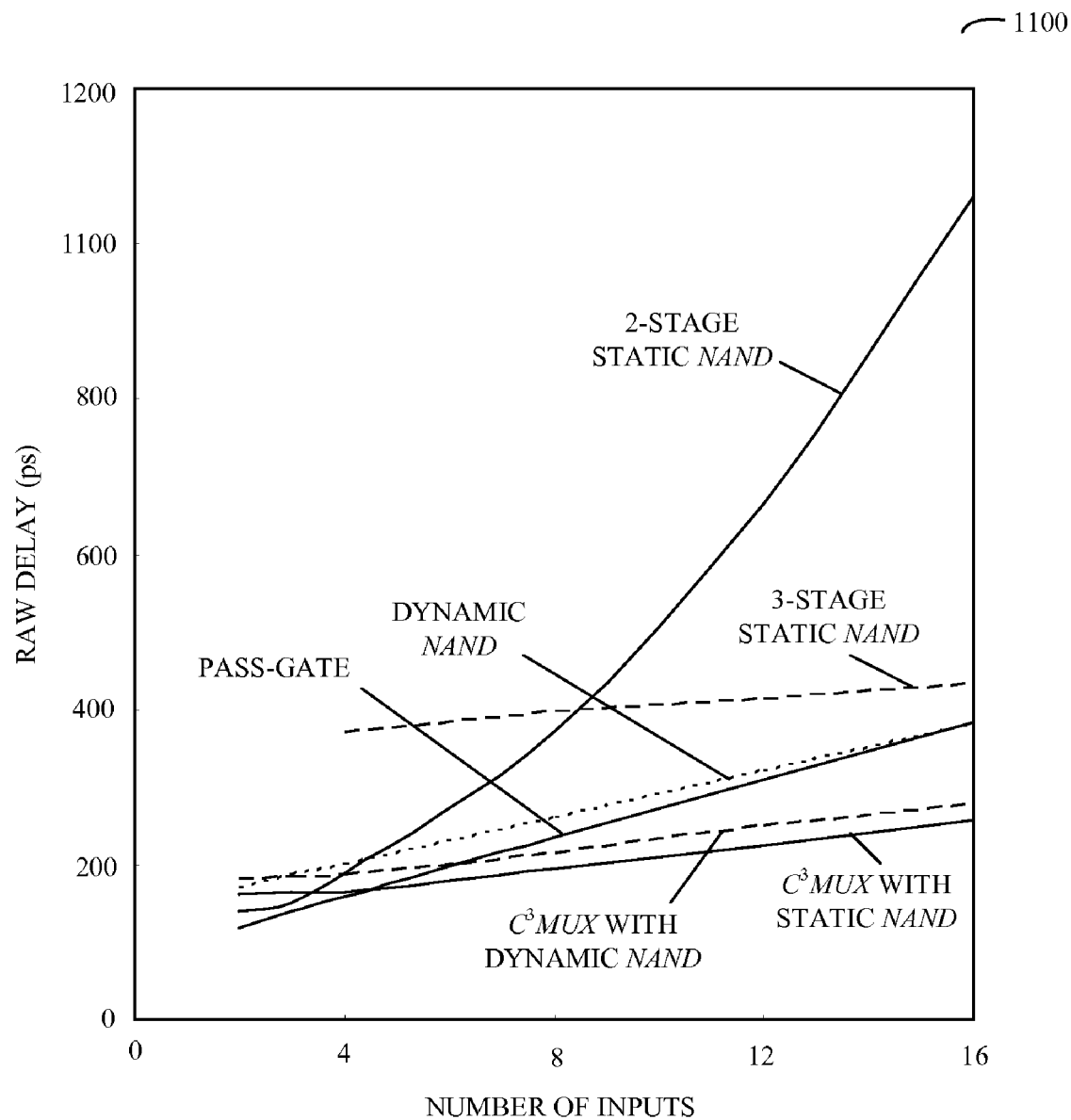
FIG. 11A is a graph illustrating raw delay for various multiplexer topologies in accordance with an embodiment of the present invention.
Figure 11B:
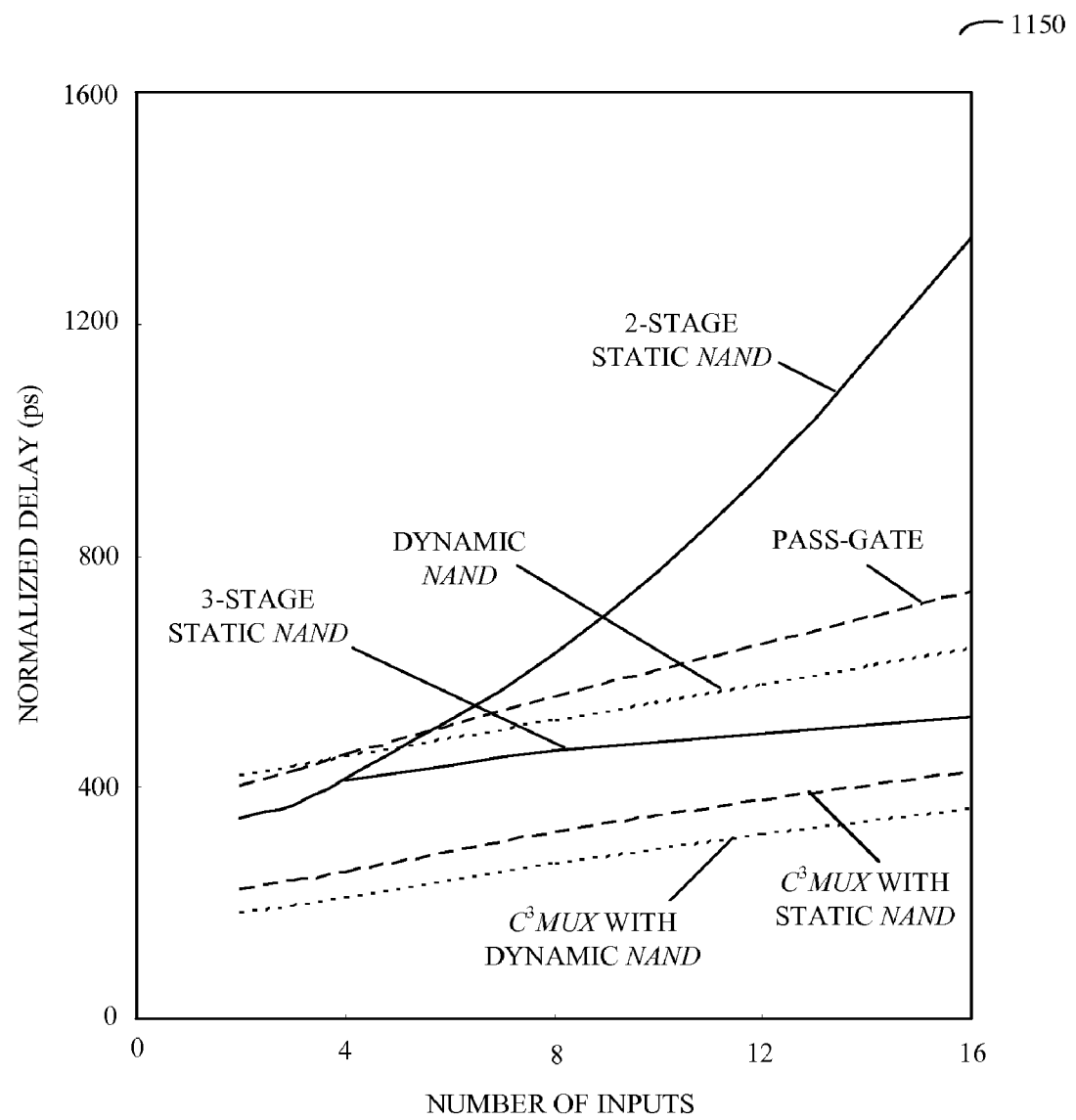
FIG. 11B is a graph illustrating normalized delay for various multiplexer topologies in accordance with an embodiment of the present invention.

FIG. 11A presents a graph 1100 illustrating raw delay for various multiplexer circuits and topologies, and FIG. 11B presents a graph 1150 illustrating normalized delay for various multiplexer circuits and topologies. Graph 1100 (FIG. 11A) shows that the optimal number of stages for the existing static NAND-gate multiplexer circuits switches from two to three stages at around eight inputs. Interestingly, all of the multiplexer circuits appear to have similar delays for two to four inputs, except, of course, for existing 2-stage dynamic NAND-gate multiplexer circuit 700 (FIG. 7), which suffers the delay penalty of an additional stage of logic.

Note that the normalized delay in graph 1150 provides a clearly different perspective from FIG. 11A. Moreover, graph 1150 provides a better indication of the real cost of the multiplexer circuits, by showing how much they load a prior stage. In the simulation results shown in graph 1150, each multiplexer circuit had its delay adjusted for the corresponding input capacitance. As noted previously, the adjustment factor is the delay added by the inverter chain coupled to the input nodes in the simulations, which is simply the delay per stage multiplied by the number of stages. In particular, the adjustment factor adds the delay of a stepup of a four-inverter chain that reduces the input capacitance from the amount in the raw delay simulation to a 3 fF input capacitance. While another input capacitance normalization can be used, this will simply raise or lower all the normalized delays by the same amount.

In graph 1150, the multiplexer circuits have their delays spread vertically over a much wider range. Existing 2-stage NAND-gate multiplexer circuit 500 (FIG. 5) and existing 3-stage NAND-gate multiplexer circuit 600 (FIG. 6) are pushed up significantly, and are similar to existing complementary pass-gate multiplexer 800 (FIG. 8) and existing 2-stage dynamic NAND-gate multiplexer circuit 700 (FIG. 7). In contrast, $C^3$mux circuit 100 (FIG. 1) maintains a delay much closer to the raw delay as its input capacitance is much closer to the 3 fF normalized value. Consequently, in graph 1150, there is a clear advantage for $C^3$mux circuit 100 (FIG. 1) in both its static and dynamic versions. Note that the dynamic version has less capacitance on its data inputs, giving it less normalized delay (which is the opposite of the raw delay results in FIG. 11A). However, as a result of its clocking inputs, it is expected to still have more energy or power consumption than the static version.

Figure 12:
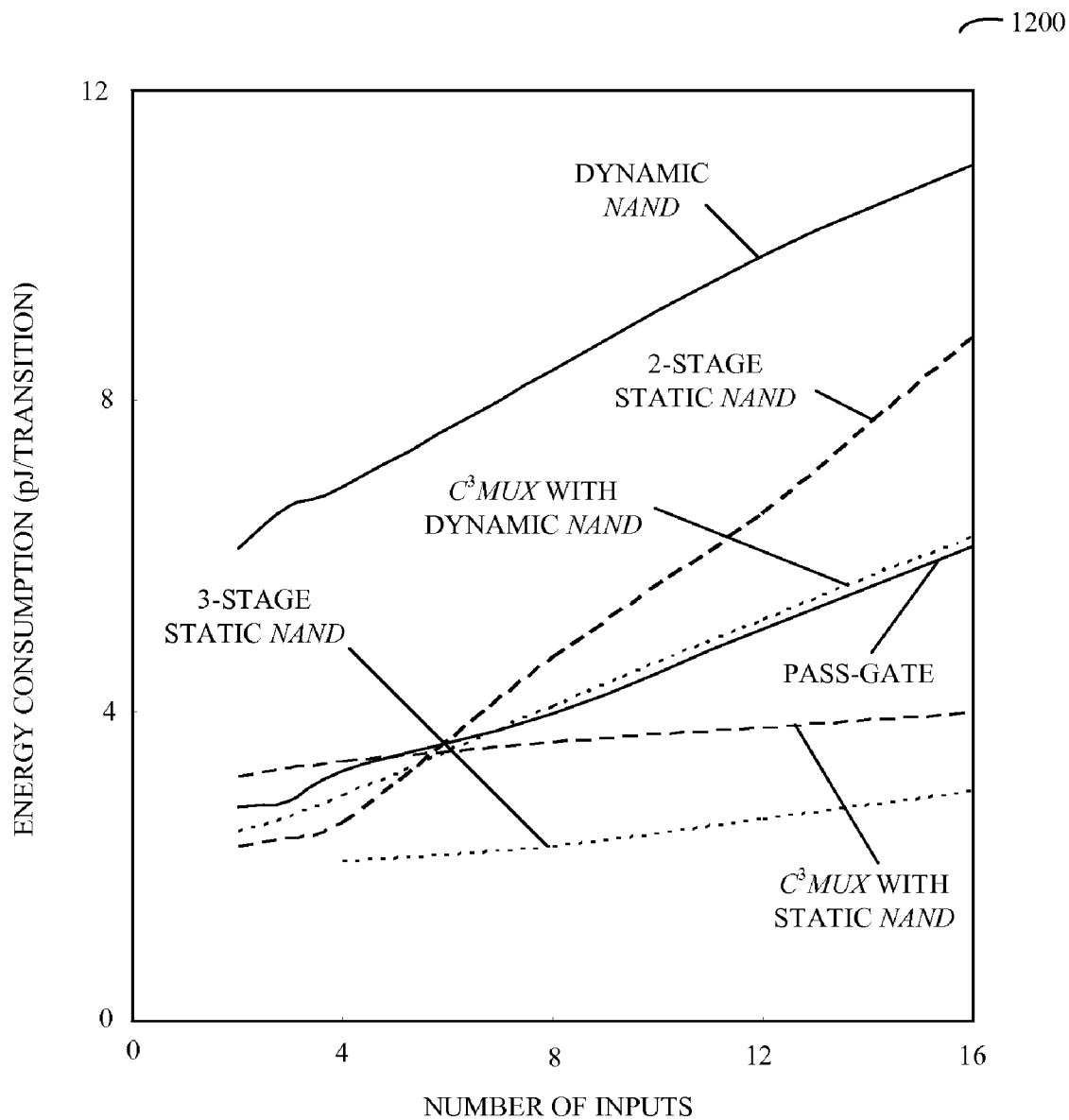
FIG. 12 is a graph illustrating energy consumption for various multiplexer topologies in accordance with an embodiment of the present invention.

FIG. 12 presents a graph 1200 illustrating energy consumption per transition for various multiplexer circuits and topologies assuming an average activity factor on all of the inputs (for the input signals and the select signals) of 50%. Because dynamic gates clock on every cycle, they suffer an energy penalty versus the static gates, which switch fewer internal nodes when the input signals and select signals do not change an internal state or output. This energy penalty of clocking dynamic gates increases with the number of inputs because each input is selected only 1/Nth of the time, yet the clock drives all N of the input NAND gates. As a consequence, the energy consumption per output transition of dynamic NAND gates increases as an almost linear function of the number of inputs.

In the static version of $C^3$mux circuit 100 (FIG. 1), optional clocked amplifier 118 (FIG. 1) adds a constant energy regardless of the input fan-in. While the dynamic version of $C^3$mux circuit 100 (FIG. 1) clocks the N NAND input gates, these gates are much smaller than those in existing 2-stage dynamic NAND-gate multiplexer circuit 700 (FIG. 1) because they are reduced by the nonlinear coupling capacitor. Therefore, the energy penalty is still proportional to the number of inputs, but with a lower constant of proportionality.

$C^3$mux circuit 100 (FIG. 1) uses input, internal and output differential paths. These differential paths double the energy consumption. While the differential outputs may be more useful in subsequent circuits, this possibility is not included in the comparison in order to provide a conservative evaluation of $C^3$mux circuit 100 (FIG. 1). Based on FIG. 12, existing 3-stage NAND-gate multiplexer circuit 600 (FIG. 6) appears to be the clear winner on energy consumption alone, although it appears that for a larger number of inputs (around 24) the static version of $C^3$mux circuit 100 (FIG. 1) is superior.

While considering energy or delay alone provides a useful view of the performance of a multiplexer circuit, the energy-delay product is a superior metric for circuit comparisons. Typically, a multiplexer circuit trades off energy for delay, obtaining a characteristic curve for optimally sized circuits that goes up in either energy or delay when the other parameter is minimized. This characteristic property can be understood as the energy being proportional to the inverse of delay raised to an exponent. Based on this performance metric, better multiplexer circuits will appear to the lower left on the plot.

Figure 13:
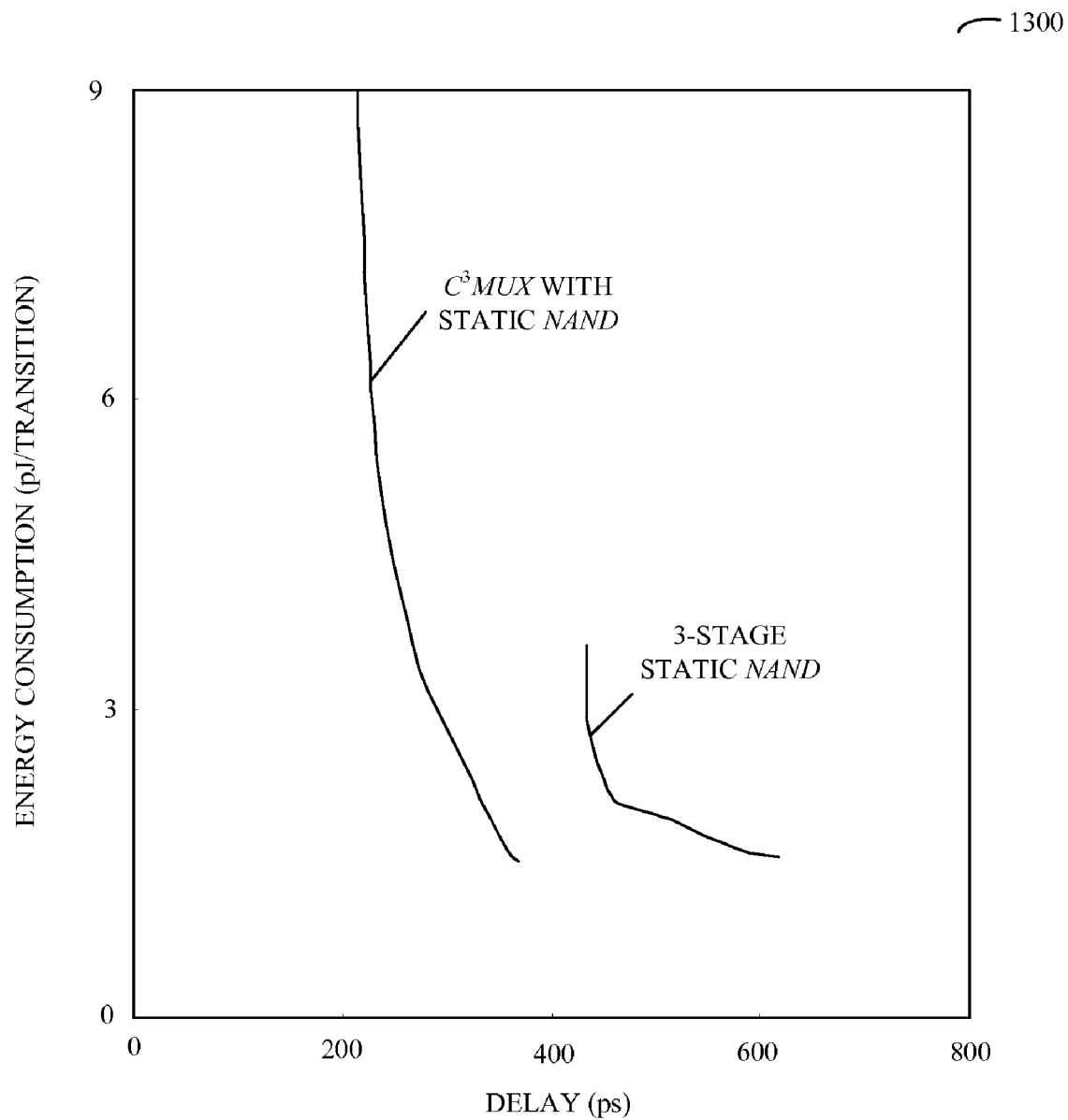
FIG. 13 is a graph illustrating energy consumption as a function of delay for various multiplexer topologies in accordance with an embodiment of the present invention.

FIG. 13 presents a graph 1300 illustrating energy consumption as a function of delay for the two multiplexer circuit implementations with the lowest energy consumption, the static version of $C^3$mux circuit 100 (FIG. 1) and existing 3-stage NAND-gate multiplexer circuit 600 (FIG. 6). In addition, graph 1300 plots the delay versus energy for a number of delay and energy design targets. In these simulation results, the multiplexer circuits have 16 inputs. In graph 1300, $C^3$mux circuit 100 (FIG. 1) provides substantial improvement over the best existing multiplexer circuits. For example, for an equal energy consumption of 3 pJ/transition, $C^3$mux circuit 100 (FIG. 1) improves the delay from about 440 ps to 290 ps. Alternatively, for an equal energy consumption of 1.5 pJ, $C^3$mux circuit 100 (FIG. 1) improves the delay from about 620 ps to 380 ps. In fact, $C^3$mux circuit 100 (FIG. 1) improves the energy or delay in all cases in graph 1300 relative to existing 3-stage NAND-gate multiplexer circuit 600 (FIG. 6). This is notable because in many comparisons of this type there may be a benefit for some portion of the curve, but not others.

While one of the N multiplexed paths was enabled in $C^3$mux circuit 100 (FIG. 1) in the preceding embodiments, in other embodiments there are multiple 'on' paths. For example, the capacitive summing may have N input paths that are simultaneously 'on' and summing to the intermediate wireor and wireorb nodes. If the number of high-enable N paths exceeds a threshold value of optional amplifier 118 (FIG. 1), the output may go high. Note that the thresholding function may include one or more Boolean logic functions, such as OR or AND, which have thresholds of $1/N-½N$ or $N-1/N+½N$ being high, respectively. Alternatively or additionally, all N paths may be enabled and the threshold value may be selected to implement an OR or an AND logic gate without multiplexing. Moreover, the threshold value can be selected to determine whether M of N 'on' paths are high, which can provide more complex logical operations than may be useful for some computations. Consequently, by selecting the threshold value of optional amplifier 118 (FIG. 1), logic functions may be implemented along with or separately from a multiplexer using $C^3$mux circuit 100 (FIG. 1). This may be useful in a content-addressable memory hit detector.

As noted previously, because the capacitive coupling blocks the DC level, in some embodiments there may be a mechanism to restore the DC level. FIG. 1 shows an example of a weakly conductive mechanism using feedback from the output digital state. Without this feedback, the DC level would be lost because the summing node of optional amplifier 118 (FIG. 1) would be capacitively coupled.

Note that the conductive coupling may be performed at the input, or at the output. While embodiments that include feedback may simplify the $C^3$mux circuit, these embodiments may require an edge on clock before the $C^3$mux circuit goes into a sleep mode so that the feedback is aligned with the data on the interconnect. Consequently, there may be a requirement for a final (extra) clock strobe before entering the sleep mode. In embodiments where the conductive coupling is performed at the input, the 'on' path drives the interconnects through the nonlinear capacitor, and has a weak conductive path that drives the internal wireor and wireorb to the same voltage that they are driven to by the capacitive coupling. This weak conductive path may be driven at the same time as the nonlinear capacitor, or it may be driven later because it is not used to drive the signal at high speed. Moreover, the weak conductive path may be de-coupled before the next time the select signals change to keep this path from fighting the next transition.

In some embodiments, the DC level is restored or maintained using a clamping circuit that compensates for leakage current on the interconnect by maintaining a voltage on the interconnect (such as a DC-bias voltage, which may be based on a history of the input signals). For example, the clamping circuit may be implemented using a conductive driver that is in parallel with the interconnect. Alternatively or additionally, the signal could be DC balanced and the mid-nodes in $C^3$mux circuit 100 (FIG. 1) maybe low-pass filtered.

Figure 14:
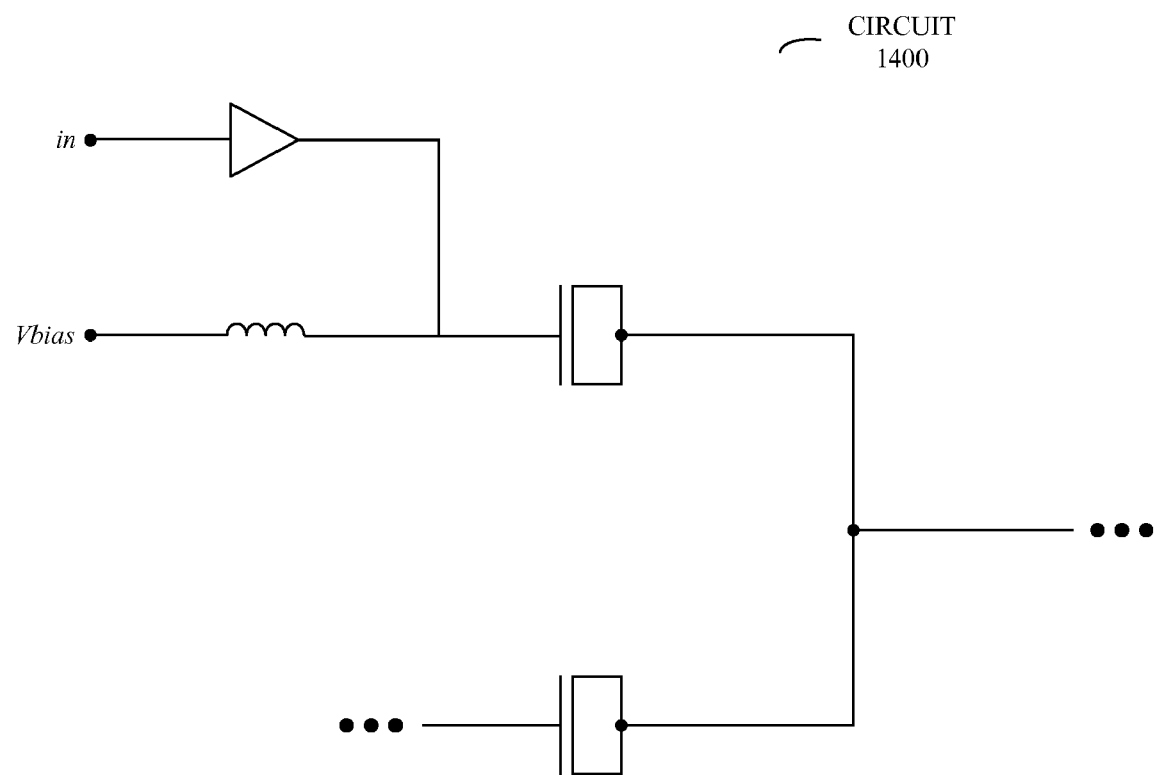
FIG. 14 is a block diagram illustrating DC biasing in a circuit in accordance with an embodiment of the present invention.
Figure 15:
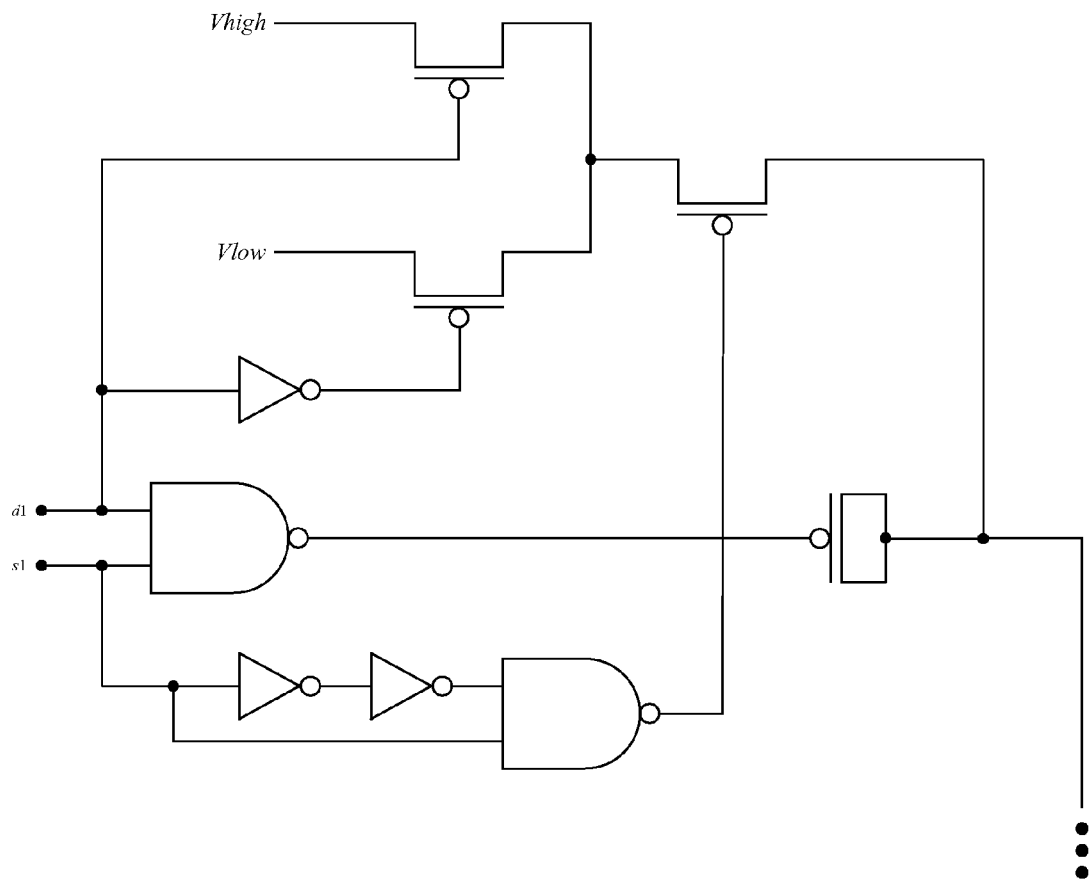
FIG. 15 is a block diagram illustrating DC biasing in a circuit in accordance with an embodiment of the present invention.

FIG. 14 presents a block diagram illustrating DC biasing in a circuit 1400, which includes fast turn off and slow turn on. Moreover, FIG. 15 presents a block diagram illustrating DC biasing in a circuit 1500. In this circuit, DC bias is applied via an inductive path that passes an analog signal once the nonlinear capacitor is turned 'on.'

In embodiments where the threshold value of optional amplifier 118 (FIG. 1) is used to implement complicated logic functions, the conductive coupling may be implemented using DC balancing and/or per-cycle equilibration.

If $C^3$mux circuit 100 (FIG. 1) is distributed over space, then the control signals to select one input may become the limitation on latency and bandwidth. To alleviate this, the select signals can be distributed ahead of the input signals, which is referred to as kiting of the control information.

Moreover, when dynamic NAND gates are used in $C^3$mux circuit 100 (FIG. 1), the speed of the data path can be increased by equilibrating the internal summing nodes. For example, a given dynamic NAND gate may have a pre-charge time during which the given dynamic NAND gate is pre-charged to a high voltage. During this time, conducting transistors may be used to couple the wireor and wireorb signals together to remove the previous signal that was on these nodes. Note that during evaluation, these conducting transistors may be switched to be blocking.

In general, PMOS gates or components in any of the preceding embodiments can be converted to an NMOS version (and vice versa). Moreover, the input signals to $C^3$mux circuit 100 (FIG. 1) may include digital signals that have approximately discrete values and/or analog signals that have continuous values.

Moreover, the preceding embodiments of $C^3$mux circuit 100 (FIG. 1) and components in $C^3$mux circuit 100 (FIG. 1) may include fewer components or additional components. Moreover, two or more components may be combined into a single component and/or a position of one or more components may be changed. In some embodiments the functionality is implemented more in hardware and less in software, or less in hardware and more in software, as is known in the art.

Figure 16:
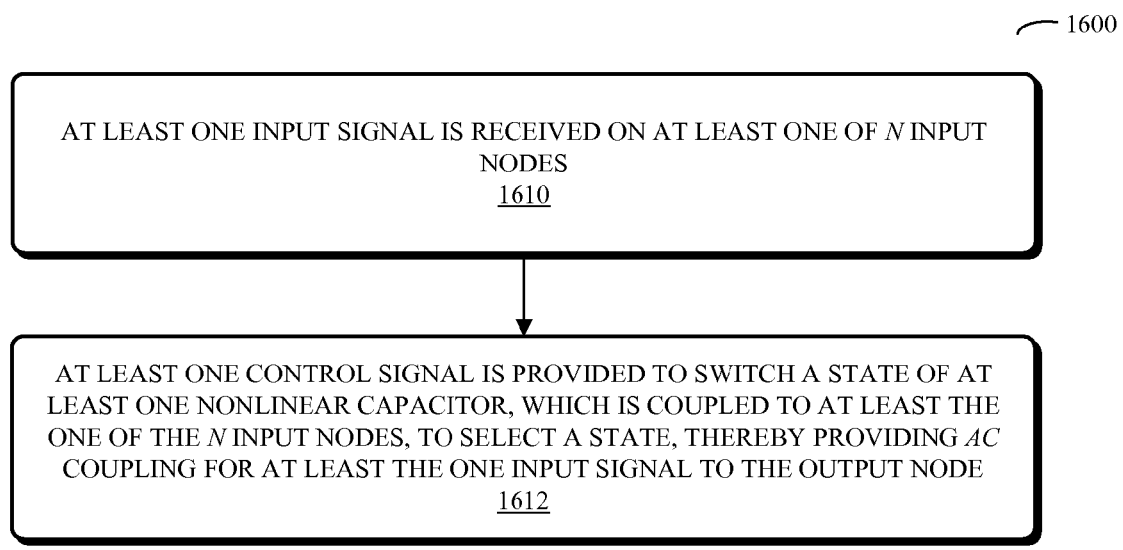
FIG. 16 is a flow chart illustrating a process for multiplexing at least one input signal to an output node in accordance with an embodiment of the present invention.

We now describe an embodiment of a process for multiplexing at least one input signal to an output node. FIG. 16 presents a flow chart illustrating a process 1600 for multiplexing at least one input signal to an output node. During operation, at least the one input signal is received on at least one of N input nodes (1610). Moreover, at least one control signal is provided to switch a state of at least one nonlinear capacitor, which is coupled to at least the one of the N input nodes, to a selected state (1612), thereby providing AC coupling for at least the one input signal to the output node. Note that at least the one nonlinear capacitor has a first capacitance, which is less than a threshold, in a non-selected state, and a second capacitance, which is greater than the threshold, in the selected state.

In some embodiments of process 1600 there may be additional or fewer operations. Moreover, the order of the operations may be changed and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A circuit, comprising:
N input nodes configured to receive input signals on input signal paths, wherein a given input node is configured to receive a given input signal on a given input signal path;
nonlinear capacitors, wherein a given nonlinear capacitor is coupled to the given input node, wherein the given nonlinear capacitor has a first capacitance, which is less than a threshold, in a non-selected state, and a second capacitance, which is greater than the threshold, in a selected state, and wherein the given nonlinear capacitor includes a metal-oxide-semiconductor (MOS) transistor that includes a gate, a drain, and a source;
an output node, coupled to the nonlinear capacitors, configured to provide an output signal on an output signal path;
control logic configured to provide at least one control signal to switch a state of at least one of the nonlinear capacitors to the selected state, thereby providing AC coupling for at least one of the input signals to the output node;
an amplifier coupled to the nonlinear capacitors and the output node; and
selection circuits, wherein inputs of a given selection circuit are coupled to the given input node and the control logic, wherein an output of the given selection circuit is coupled to the given nonlinear capacitor, and wherein the selection circuits include static NAND gates, dynamic NAND gates, static NOR gates, or dynamic NOR gates.

2. The circuit of claim 1, wherein a default state of each of the given nonlinear capacitors is the non-selected state.

3. The circuit of claim 1, wherein the input signals include digital signals that have approximately discrete values.

4. The circuit of claim 1, wherein the input signals include analog signals that have continuous values.

5. The circuit of claim 1,
wherein a capacitance of the given nonlinear capacitor, which can be the first capacitance or the second capacitance, is associated with gate-to-source capacitance and gate-to-drain capacitance of the MOS transistor.

6. The circuit of claim 5, wherein the second capacitance is associated with a channel between the drain and the source in the MOS transistor.

7. The circuit of claim 1, wherein the circuit comprises a multiplexer.

8. The circuit of claim 1, wherein the control logic is configured to provide at least the one control signal prior to the circuit receiving at least the one of the input signals.

9. The circuit of claim 1, further comprising a DC-bias circuit configured to maintain a DC level of the output signal at a capacitively coupled signal level associated with the AC coupling of at least the one of the input signals to the output node.

10. The circuit of claim 1, wherein the selection circuits include NMOS circuits or PMOS circuits.

11. The circuit of claim 1,
wherein the output of the given selection circuit is coupled to the gate of the MOS transistor.

12. The circuit of 1,
wherein the output of the given selection circuit is coupled to the source and a drain of the MOS transistor.

13. The circuit of claim 1, wherein the amplifier includes conductive feedback from the output node to one or more inputs to the amplifier.

14. The circuit of claim 1, wherein at least the one of the nonlinear capacitors includes M nonlinear capacitors that are in the selected state; and
wherein M is greater than one and less than or equal to N.

15. The circuit of claim 14, wherein a threshold of the amplifier is selected to implement a logic function in which the output signal is asserted if P of the input signals corresponding to the M nonlinear capacitors are asserted; and
wherein P is less than or equal to M.

16. A multiplexer, comprising:
N input nodes configured to receive input signals on input signal paths, wherein a given input node is configured to receive a given input signal on a given input signal path;
nonlinear capacitors, wherein a given nonlinear capacitor is coupled to the given input node, wherein the given nonlinear capacitor has a first capacitance, which is less than a threshold, in a non-selected state, and a second capacitance, which is greater than the threshold, in a selected state; and wherein the given nonlinear capacitor includes a metal-oxide-semiconductor (MOS) transistor that includes a gate, a drain, and a source;
an output node, coupled to the nonlinear capacitors, configured to provide an output signal on an output signal path;
control logic configured to provide at least one control signal to switch a state of at least one of the nonlinear capacitors to the selected state, thereby providing AC coupling for at least one of the input signals to the output node;
an amplifier coupled to the nonlinear capacitors and the output node; and
selection circuits, wherein inputs of a given selection circuit are coupled to the given input node and the control logic, wherein an output of the given selection circuit is coupled to the given nonlinear capacitor, and wherein the selection circuits include static NAND gates, dynamic NAND gates, static NOR gates, or dynamic NOR gates.

17. A method for multiplexing at least one input signal to an output node;
receiving at least the one input signal on at least one of N input nodes;
providing, using one or more selection circuits and control logic, at least one control signal to switch a state of at least one nonlinear capacitor, which is coupled to at least the one of the N input nodes, to a selected state, thereby providing AC for coupling at least the one input signal to the output node; and
amplifying a signal on the output node using an amplifier that is coupled to the at least one nonlinear capacitor and the output node,
wherein at least the one nonlinear capacitor has a first capacitance, which is less than a threshold, in a non-selected state, and a second capacitance, which is greater than the threshold, in the selected state, and wherein the at least one nonlinear capacitor includes a metal-oxide-semiconductor (MOS) transistor that includes a gate, a drain, and a source,
wherein inputs of a given selection circuit are coupled to the given input node and the control logic, wherein an output of the given selection circuit is coupled to the given nonlinear capacitor and wherein the selection circuits include static NAND gates, dynamic NAND gates, static NOR gates, or dynamic NOR gates.

\* \* \* \* \*